(12) United States Patent  (10) Patent No.: US 7,336,097 B2
Madurawe  (45) Date of Patent: Feb. 26, 2008

(54) LOOK-UP TABLE STRUCTURE WITH EMBEDDED CARRY LOGIC

(75) Inventor: Raminda Udaya Madurawe, Sunnyvale, CA (US)

(73) Assignee: Viciciv, Inc., Santa Clara, CA (US)

( * ) Notice: Subject to any disclaimer, the term of this patent is extended or adjusted under 35 U.S.C. 154(b) by 0 days.

(21) Appl. No.: 11/728,839

(22) Filed: Mar. 28, 2007

(65) Prior Publication Data

US 2007/0171105 A1    Jul. 26, 2007

Related U.S. Application Data

(63) Continuation-in-part of application No. 11/355,931, filed on Feb. 17, 2006, now Pat. No. 7,176,716, which is a continuation-in-part of application No. 10/743,894, filed on Dec. 24, 2003, now Pat. No. 7,019,557.

(51) Int. Cl.
  *H03K 19/173*    (2006.01)
(52) U.S. Cl. .................................. 326/38; 326/41
(58) Field of Classification Search ............. 326/37–41
  See application file for complete search history.

(56) References Cited

U.S. PATENT DOCUMENTS

| | | | |
|---|---|---|---|
| 4,706,216 A | 11/1987 | Carter | |
| 4,870,302 A | 9/1989 | Freeman | |
| 4,873,459 A | 10/1989 | El Gamal et al. | |
| 5,274,581 A | 12/1993 | Cliff et al. | |
| 5,343,406 A | 8/1994 | Freeman et al. | |
| 5,481,486 A | 1/1996 | Cliff et al. | |
| 5,488,316 A | 1/1996 | Freeman et al. | |
| RE35,977 E | 12/1998 | Cliff et al. | |
| 5,844,422 A | 12/1998 | Trimberger et al. | |
| 5,851,726 A | 12/1998 | Cliff | |
| 5,926,036 A | 7/1999 | Cliff et al. | |
| 6,107,822 A | 8/2000 | Mendel et al. | |
| 6,122,720 A | 9/2000 | Cliff | |
| 6,134,173 A | 10/2000 | Cliff et al. | |
| 6,208,163 B1 | 3/2001 | Wittig et al. | |
| 6,271,680 B1 | 8/2001 | Mendel et al. | |
| 6,275,065 B1 | 8/2001 | Mendel | |
| 6,331,789 B2 | 12/2001 | Or-Bach | |
| 6,353,920 B1 | 3/2002 | Wittig et al. | |

(Continued)

OTHER PUBLICATIONS

Seals & Whapshott, "Programmable Logic—PLDs and FPGAs", 1997, pp. 102-117, McGraw-Hill, USA, no month.

(Continued)

*Primary Examiner*—Don Le
(74) *Attorney, Agent, or Firm*—Tran & Associates

(57) ABSTRACT

A programmable look-up-table (LUT) structure adapted for carry logic incrementer implementation in an integrated circuit, comprising: three or more data inputs and a carry-in input, said data inputs comprised of consecutive bits in a data string, said carry-in comprised of the increment value to the least order bit of said data string; and three or more data outputs and a carry-out output, said data outputs comprised of the incremented values of said data inputs, and said carry-out resulting from the incremented value of the highest order bit of said data inputs; wherein, said three or more data outputs are computed in a single carry computation stage within the LUT structure.

20 Claims, 22 Drawing Sheets

U.S. PATENT DOCUMENTS

| | | |
|---|---|---|
| 6,448,808 B2 | 9/2002 | Young et al. |
| 6,466,052 B1 | 10/2002 | Kaviani |
| 6,515,511 B2 | 2/2003 | Sugibayashi et al. |
| 6,750,674 B1 | 6/2004 | Kundu et al. |
| 6,801,052 B2 | 10/2004 | Pugh et al. |
| 6,888,373 B2 | 5/2005 | Kaptanoglu et al. |
| 6,915,323 B1 | 7/2005 | Chang et al. |
| 6,937,064 B1 | 8/2005 | Lewis et al. |
| 6,957,245 B2 | 10/2005 | Tam |
| 6,990,508 B1 | 1/2006 | Mohammed et al. |
| 7,030,650 B1 | 4/2006 | Kaptanoglu et al. |
| 7,061,268 B1 | 6/2006 | Lee et al. |
| 7,167,021 B1 | 1/2007 | Lewis |
| 7,193,433 B1 | 3/2007 | Young |
| 2001/0003428 A1 | 6/2001 | Or-Bach |
| 2001/0048320 A1 | 12/2001 | Lee et al. |
| 2002/0186044 A1 | 12/2002 | Agrawai et al. |
| 2003/0001615 A1 | 1/2003 | Sueyoshi at al. |
| 2003/0085733 A1 | 5/2003 | Pugh et al. |
| 2005/0040849 A1* | 2/2005 | Pugh et al. .............. 326/39 |
| 2006/0091903 A1* | 5/2006 | Sood ....................... 326/40 |
| 2007/0244961 A1* | 10/2007 | Schmit et al. ............ 708/700 |

OTHER PUBLICATIONS

Ashok K. Sharma, "Programmable Logic Handbook—PLDs, CPLDs, & FPGAs", 1998, pp. 99-171, McGraw-Hill, USA, no month.

E. Ahmed, J. Rose, "The Effect of LUT and Cluster Size on Deep-Submicron FPGA Performance and Density", FPGA 2000, Monterey, CA, 2000, no month.

* cited by examiner $F = A'B'C'+AC'D'+B'CD+A'BC+BCD'$
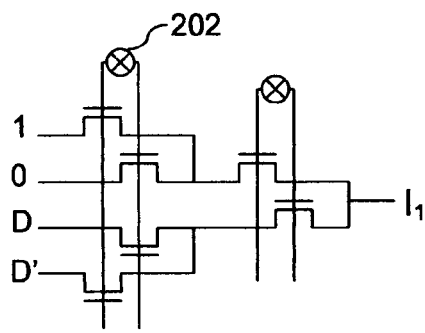
Fig-2A
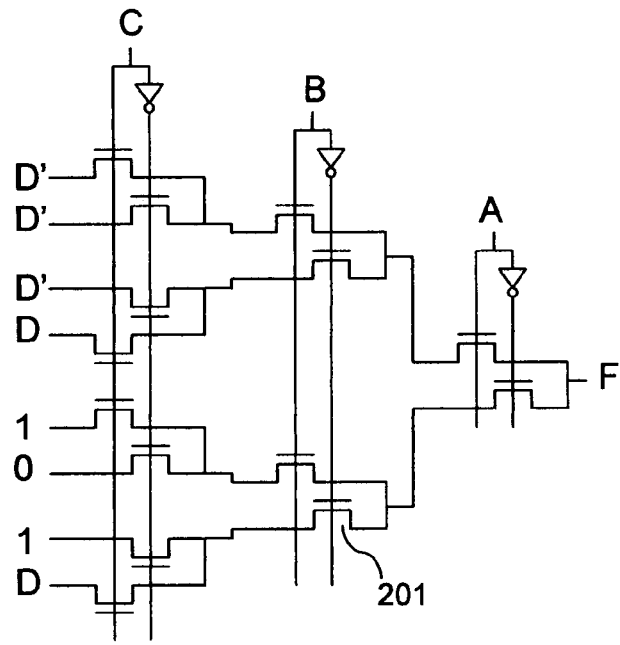
Fig-2B
Fig-2C
$F = A'B'C'+AC'D'+B'CD+A'BC+BCD'$
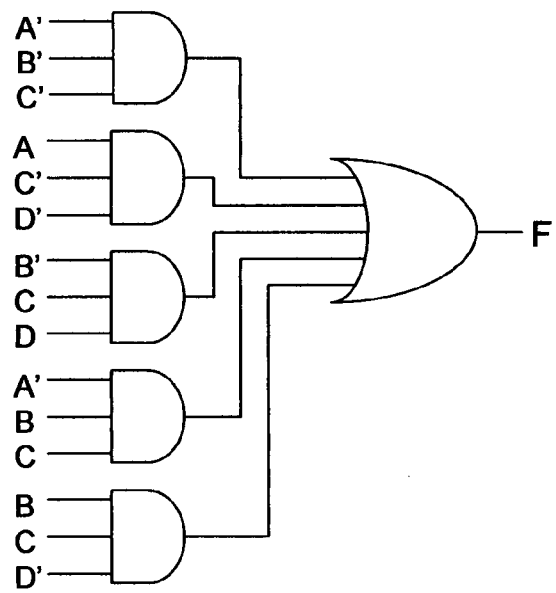
Fig-2D

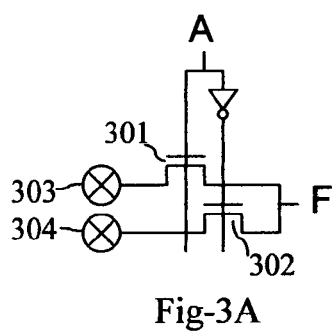
Fig-3A
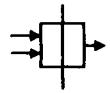
Fig-3B
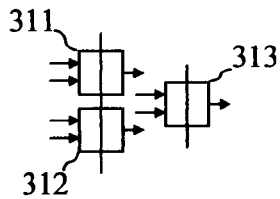
Fig-3C
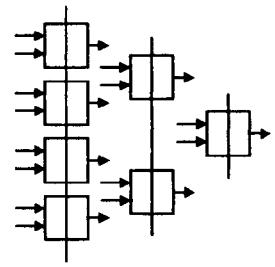
Fig-3D
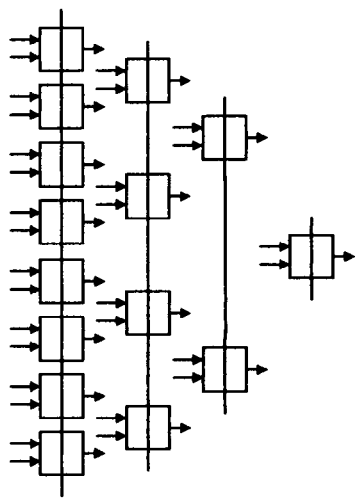
Fig-3E
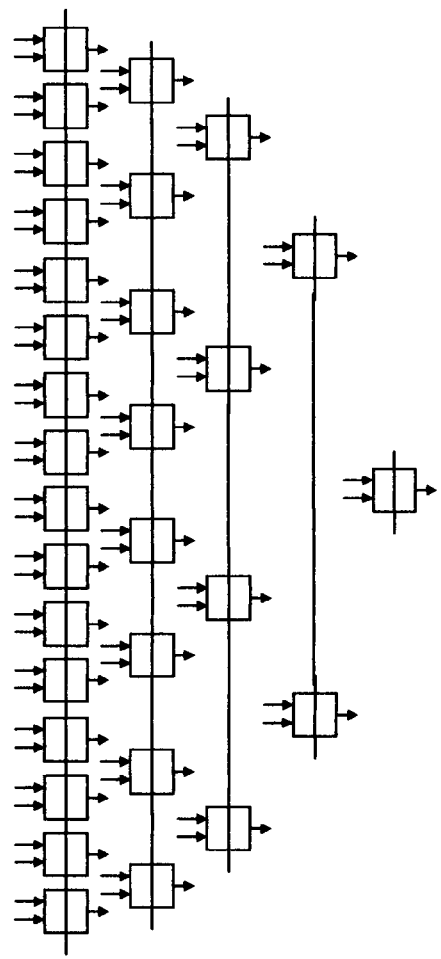
Fig-3F
| K-LUT | Per K-LUT |
|---|---|
| K | # 1-LUTs |
| 2 | 3 |
| 3 | 7 |
| 4 | 15 |
| 5 | 31 |
| 6 | 63 |
| 7 | 127 |
Fig-3G

| K-LUT K | No of K-LUTs | Per K-LUT # 1-LUTs | Equivalent 1-LUTs | % 1-LUT Utilization |
|---|---|---|---|---|
| 2 | 4300 | 3 | 12900 | 100.0% |
| 3 | 3000 | 7 | 21000 | 61.4% |
| 4 | 2380 | 15 | 35700 | 36.1% |
| 5 | 2000 | 31 | 62000 | 20.8% |
| 6 | 1600 | 63 | 100800 | 12.8% |
| 7 | 1400 | 127 | 177800 | 7.3% |
Fig-4
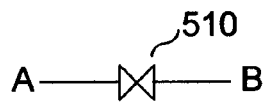
Fig-5A
Fig-5B
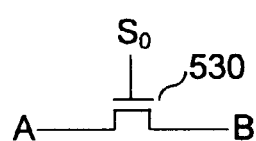
Fig-5C
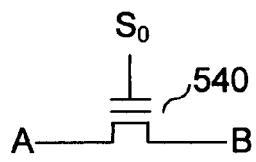
Fig-5D
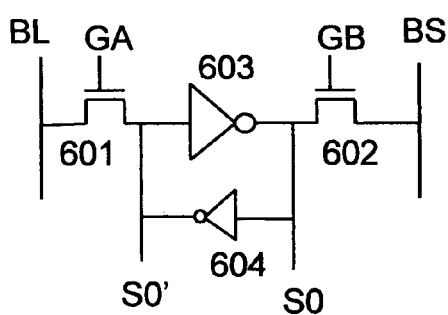
Fig-6A
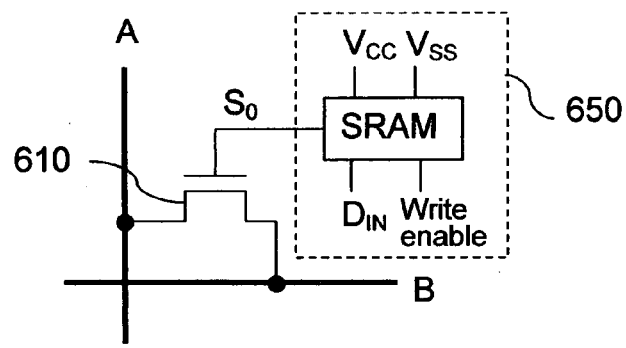
Fig-6B

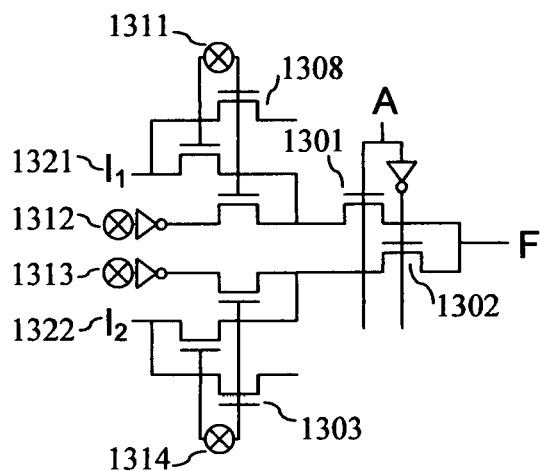
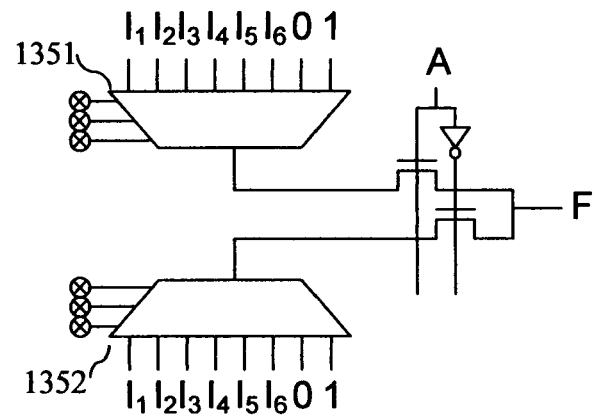
Fig-13A Fig-13B
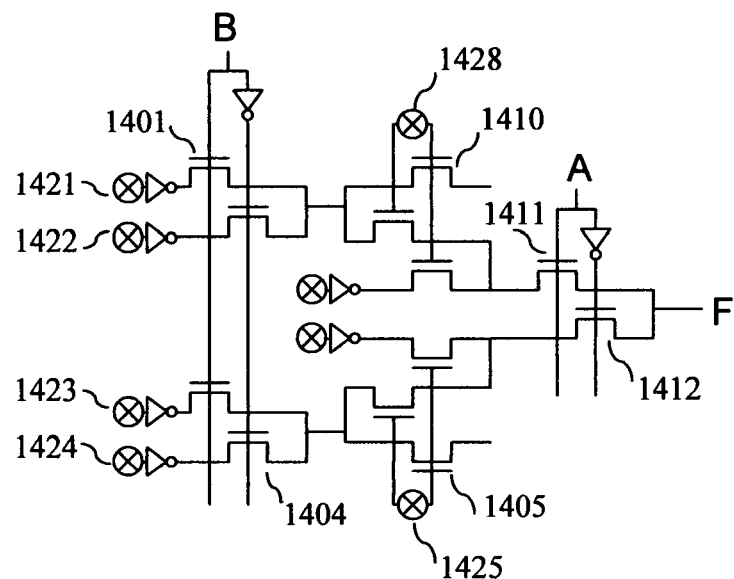
Fig-14

F = A + BC' + CD
|    | CD |    |    |    |
|----|----|----|----|----|
| AB | 00 | 01 | 11 | 10 |
| 00 | 0  | 0  | 1  | 0  |
| 01 | 1  | 1  | 1  | 0  |
| 11 | 1  | 1  | 1  | 1  |
| 10 | 1  | 1  | 1  | 1  |
Fig-18A
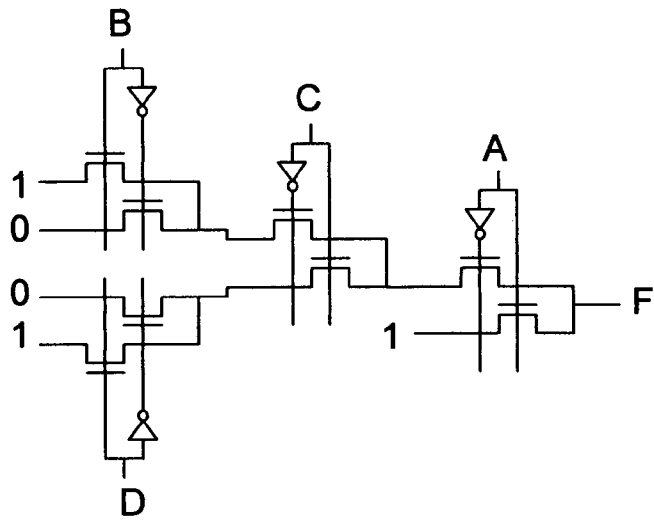
Fig-18B
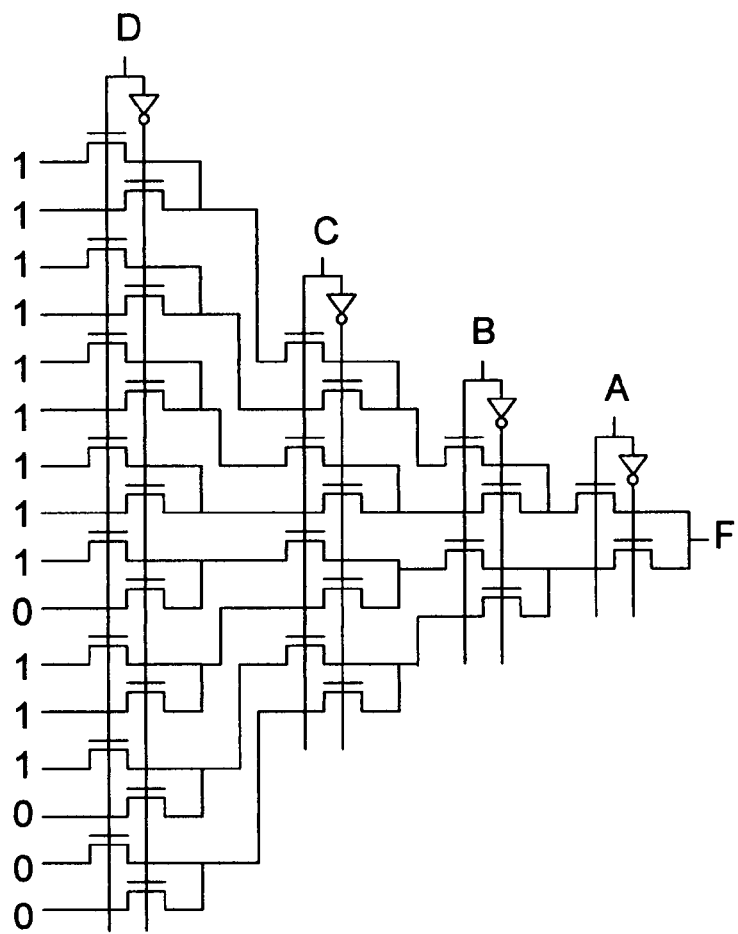
Fig-18C $S_i = A_i \oplus B_i \oplus C_{i-1}$ $C_i = A_i B_i + C_{i-1}(A_i \oplus B_i)$ $A_i B_i = A_i \overline{(A_i \oplus B_i)} = B_i \overline{(A_i \oplus B_i)}$ $C_i = B_i \overline{(A_i \oplus B_i)} + C_{i-1}(A_i \oplus B_i)$ $C_i = A_i \overline{(A_i \oplus B_i)} + C_{i-1}(A_i \oplus B_i)$

| $A_i$ | $B_i$ | $C_{i-1}$ | $S_i$ | $C_i$ |
|---|---|---|---|---|
| 0 | 0 | 0 | 0 | 0 |
| 0 | 1 | 0 | 1 | 0 |
| 1 | 0 | 0 | 1 | 0 |
| 1 | 1 | 0 | 0 | 1 |
| 0 | 0 | 1 | 1 | 0 |
| 0 | 1 | 1 | 0 | 1 |
| 1 | 0 | 1 | 0 | 1 |
| 1 | 1 | 1 | 1 | 1 |

$$D_i = A_i \oplus \overline{B}_i \oplus C_{i-1}$$
$$C_i = A_i\overline{B}_i + C_{i-1}(A_i \oplus \overline{B}_i)$$
$$A_i\overline{B}_i = A_i \overline{(A_i \oplus \overline{B}_i)} = \overline{B}_i \overline{(A_i \oplus \overline{B}_i)}$$
$$C_i = \overline{B}_i \overline{(A_i \oplus \overline{B}_i)} + C_{i-1}(A_i \oplus \overline{B}_i)$$
$$C_i = A_i \overline{(A_i \oplus \overline{B}_i)} + C_{i-1}(A_i \oplus \overline{B}_i)$$

FIG – 21A

| $A_i$ | $/B_i$ | $C_{i-1}$ | $D_i$ | $C_i$ |
|---|---|---|---|---|
| 0 | 0 | 0 | 0 | 0 |
| 0 | 1 | 0 | 1 | 0 |
| 1 | 0 | 0 | 1 | 0 |
| 1 | 1 | 0 | 0 | 1 |
| 0 | 0 | 1 | 1 | 0 |
| 0 | 1 | 1 | 0 | 1 |
| 1 | 0 | 1 | 0 | 1 |
| 1 | 1 | 1 | 1 | 1 |

FIG – 21B

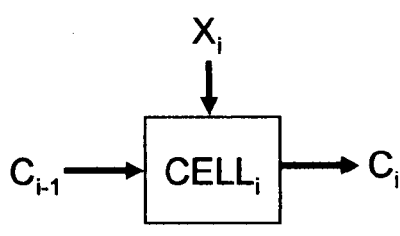

FIG – 22A n-bit word: $X_1 X_2 X_3 X_4 \ldots X_n$
$C_i = X_i \oplus C_{i-1}$
$C_0 = 0$
Odd # 1s in word $C_n = 1$
Even # 1s in word $C_n = 0$

FIG – 22B

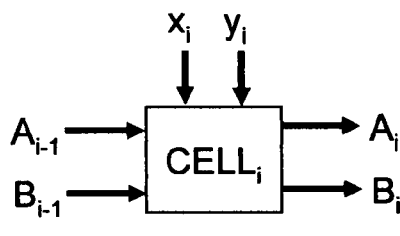

FIG – 23A $X = x_1 x_2 x_3 x_4 \ldots x_n$
$Y = y_1 y_2 y_3 y_4 \ldots y_n$
$A_i = 1 \cdot A_{i-1} + (\overline{x}_i y_i \overline{B}_{i-1}) \overline{A}_{i-1}$
$B_i = 1 \cdot B_{i-1} + (x_i \overline{y}_i \overline{A}_{i-1}) \overline{B}_{i-1}$

FIG – 23B

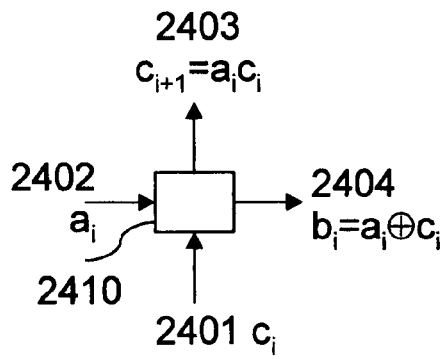
Fig-24A: prior art
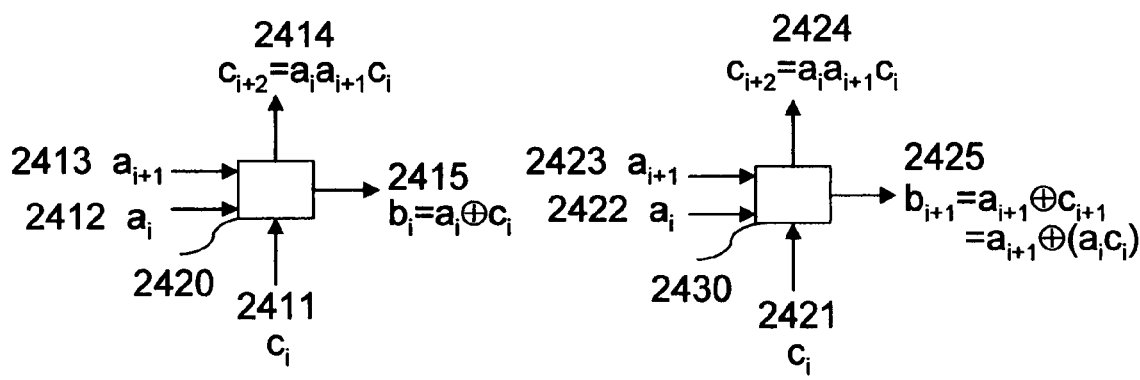
Fig-24B: prior art
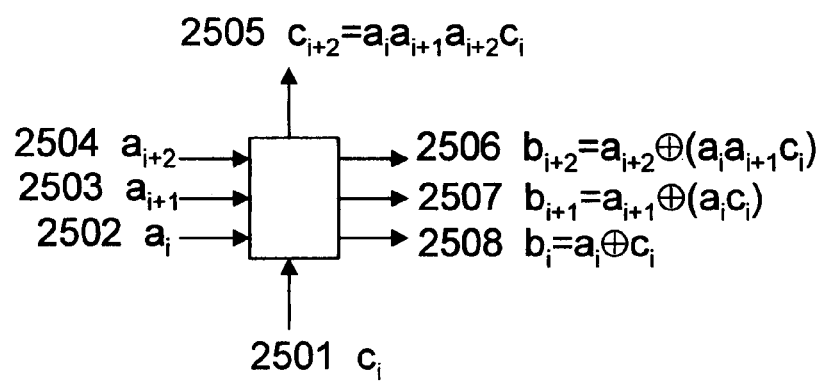
Fig-25A

LOOK-UP TABLE STRUCTURE WITH EMBEDDED CARRY LOGIC

This application is a continuation-in-part of application Ser. No. 11/355,931 (now U.S. Pat. No. 7,176,716) filed on Feb. 17, 2006, which is a continuation-in-part of application Ser. No. 10/743,894 (now U.S. Pat. No. 7,019,557), filed on Dec. 24, 2003, which is related to application Ser. Nos. 10/267,483, 10/267,484 and 10/267,511 (now U.S. Pat. No. 6,747,478), all of which were filed on Oct. 8, 2002 and list as inventor Mr. R. U. Madurawe, the contents of which are incorporated herein by reference.

This application is also related to application Ser. No. 10/413,808 (now abandoned), Ser. No. 10/413,809 (now U.S. Pat. No. 6,856,030) and Ser. No. 10/413,810 (now U.S. Pat. No. 6,828,689), all of which were filed Apr. 14, 2003 and list as inventor Mr. R. U. Madurawe, the contents of which are incorporated herein by reference. This application is further related to application Ser. No. 10/691,013 filed Oct. 23, 2003, Ser. No. 10/727,170 filed Dec. 4, 2003, Ser. No. 10/762,627 (now U.S. Pat. No. 7,018,875) filed Jan. 23, 2004, Ser. No. 10/846,699 filed May 17, 2004, Ser. No. 10/937,828 filed 19, Oct. 2004 and Ser. No. 10/988,396 filed Nov. 15, 2004, Ser. No. 11/350,628 filed Feb. 10, 2006 (now U.S. Pat. No. 7,208,976), Ser. No. 11/546,681 filed Oct. 13, 2006, all of which list as inventor Mr. R. U. Madurawe, the contents of which are incorporated herein by reference.

BACKGROUND

The present invention relates to look up table (LUT) structures for programmable logic applications. More specifically, it relates to programmable LUT structures capable of implementing efficient incrementers/decrementers using fast and dense carry logic.

Traditionally, application specific integrated circuit (ASIC) devices have been used in the integrated circuit (IC) industry to reduce cost, enhance performance or meet space constraints. The generic class of ASIC devices falls under a variety of sub classes such as Custom ASIC, Standard cell ASIC, Gate Array and Field Programmable Gate Array (FPGA) where the degree of user allowed customization varies. In this disclosure the word ASIC is used only in reference to Custom and Standard Cell ASICs where the designer has to incur the cost of a full fabrication mask set. The term FPGA denotes an off the shelf programmable device with no fabrication mask costs, and Gate Array denotes a device with partial mask costs to the designer. The devices FPGA include Programmable Logic Devices (PLD) and Complex Programmable Logic Devices (CPLD), while the devices Gate Array include Laser Programmable Gate Arrays (LPGA), Mask Programmable Gate Arrays (MPGA) and a new class of devices known as Structured ASIC or Structured Arrays.

The design and fabrication of ASICs can be time consuming and expensive. The customization involves a lengthy design cycle during the product definition phase and high Non Recurring Engineering (NRE) costs during manufacturing phase. In the event of finding a logic error in the custom or semi-custom ASIC during final test phase, the design and fabrication cycle has to be repeated. Such lengthy correction cycles further aggravate the time to market and engineering cost. As a result, ASICs serve only specific applications and are custom built for high volume and low cost. The high cost of masks and unpredictable device life time shipment volumes have caused ASIC design starts to fall precipitously in the IC industry. ASICs offer no device for immediate design verification, no interactive design adjustment capability, and require a full mask set for fabrication.

Gate Array customizes pre-defined modular blocks at a reduced NRE cost by designing the module connections with a software tool similar to that in ASIC. The Gate Array has an array of non programmable (or moderately programmable) functional modules fabricated on a semiconductor substrate. To interconnect these modules to a user specification, multiple layers of wires are used during design synthesis. The level of customization may be limited to a single metal layer, or single via layer, or multiple metal layers, or multiple metals and via layers. The goal is to reduce the customization cost to the user, and provide the customized product faster. As a result, the customizable layers are designed to be the top most metal and via layers of a semiconductor fabrication process. This is an inconvenient location to customize wires. The customized transistors are located at the substrate level of the Silicon. All possible connections have to come up to the top level metal. The complexity of bringing up connections is a severe constraint for these devices. Structured ASICs fall into larger module Gate Arrays. These devices have varying degrees of complexity in the structured cell and varying degrees of complexity in the custom interconnection The absence of Silicon for design verification and design optimization results in multiple spins and lengthy design iterations to the end user. The Gate Array evaluation phase is no different to that of an ASIC. The advantage over ASIC is in a lower upfront NRE cost for the fewer customization layers, tools and labor, and the shorter time to receive the finished product. Gate Arrays offer no device for immediate design verification, no interactive design adjustment capability, and require a partial mask set for fabrication. Compared to ASICs, Gate Arrays offer a lower initial cost and a faster turn-around to debug the design. The end IC is more expensive compared to an ASIC.

In recent years there has been a move away from custom, semi-custom and Gate Array ICs toward field programmable components whose function is determined not when the integrated circuit is fabricated, but by an end user "in the field" prior to use. Off the shelf FPGA products greatly simplify the design cycle and are fully customized by the user. These products offer user-friendly software to fit custom logic into the device through programmability, and the capability to tweak and optimize designs to improve Silicon performance. Provision of this programmability is expensive in terms of Silicon real estate, but reduces design cycle time, time to solution (TTS) and upfront NRE cost to the designer. FPGAs offer the advantages of low NRE costs, fast turn-around (designs can be placed and routed on an FPGA in typically a few minutes), and low risk since designs can be easily amended late in the product design cycle. It is only for high volume production runs that there is a cost benefit in using the other two approaches. Compared to FPGA, an ASIC and Gate Array both have hard-wired logic connections, identified during the chip design phase. ASIC has no multiple logic choices and both ASIC and most Gate Arrays have no configuration memory to customize logic. This is a large chip area and a product cost saving for these approaches to design. Smaller die sizes also lead to better performance. A full custom ASIC has customized logic functions which take less gate counts compared to Gate Arrays and FPGA configurations of the same functions. Thus, an ASIC is significantly smaller, faster, cheaper and more reliable than an equivalent gate-count FPGA. A Gate Array is also smaller, faster and cheaper compared to an equivalent FPGA. The trade-off is between time-to-market (FPGA advantage) versus low cost and better reliability (ASIC advantage). A Gate Array falls in the middle with an improvement in the ASIC NRE cost at a moderate penalty to product cost and performance. The cost of Silicon real estate for programmability provided by the FPGA compared to ASIC and Gate Array contribute to a significant portion of the extra cost the user has to bear for customer re-configurability in logic functions.

In an FPGA, a complex logic design is broken down to smaller logic blocks and programmed into logic blocks provided in the FPGA. Logic blocks contain multiple smaller logic elements. Logic elements facilitate sequential and combinational logic design implementations. Combinational logic has no memory and outputs reflect a function solely of present input states. Sequential logic is implemented by inserting memory in the form of a flip-flop into the logic path to store past history. Current FPGA architectures include transistor pairs, NAND or OR gates, multiplexers, look-up-tables (LUT) and AND-OR structures in a basic logic element. In a PLD the basic logic element is labeled a macro-cell. Hereafter the terminology logic element will include both logic elements and macro-cells. Granularity of an FPGA refers to logic content in the basic logic block. Partitioned smaller blocks of a complex logic design are customized to fit into FPGA grain. In fine-grain architectures, one or a few small basic logic elements are grouped to form a basic logic block, then enclosed in a routing matrix and replicated. A fine grain logic element may contain a 2-input MUX or a 2-input LUT and a register. These offer easy logic fitting at the expense of complex routing. In course grain architectures, many larger logic elements are combined into a basic logic block with local routing. A course grain logic element may include a 4-input LUT with a register, and a logic block may include as many as 4 to 8 logic elements. The larger logic block is then replicated with a global routing matrix. Larger logic blocks make the logic fitting difficult and the routing easier. A challenge for FPGA architectures is to provide easy logic fitting (like fine grain) and maintain easy routing (like course grain). Course grain architectures are faster in logic operations and there is an increasing need in the IC industry to utilize larger logic blocks with multiple bigger LUT structures.

For sequential logic designs, the logic element may also include flip-flops. A MUX based exemplary logic element described in Ref-1 (Seals & Whapshott) is shown in FIG. 1A. The logic element has a built in D-flip-flop 105 for sequential logic implementation. In addition, elements 101, 102 and 103 are 2:1 MUX's controlled by one input signal for each MUX. Input S1 feeds into 101 and 102, while inputs S1 and S2 feed into OR gate 104, and the output from OR gate feeds into 103. Element 105 is the D-Flip-Flop receiving Preset, Clear and Clock signals. One may very easily represent the programmable MUX structure in FIG. 1A as a 2-input LUT; where A, B, C & D are LUT values, and S1, (S2+S3) are LUT inputs. Ignoring the global Preset & Clear signals, eight inputs feed into the logic block, and one output leaves the logic block. All 2-input, all 3-input and some 4-input variable functions are realized in the logic block and latched to the D-Flip-Flop. Inputs and outputs for the Logic Element or Logic Block are selected from the programmable Routing Matrix. An exemplary routing matrix containing logic elements as described in Ref-1 is shown in FIG. 1B. Each logic element 112 is as shown in FIG. 1A. The 8 inputs and 1 output from logic element 112 in FIG. 1B are routed to 22 horizontal and 12 vertical interconnect wires that have programmable via connections 110. These connections 110 may be anti-fuses or pass-gate transistors controlled by SRAM memory elements. The user selects how the wires are connected during the design phase, and programs the connections in the field. FPGA architectures for various commercially available FPGA devices are discussed in Ref-1 (Seals & Whapshott) and Ref-2 (Sharma).

Logic implementation in logic elements is achieved by converting a logic equation or a truth table to a gate realization. The gate level description comprising elements and nets is also called a netlist. The resulting logic gates are ported to LUT or MUX structure in the logic element. An exemplary truth table and a plurality of transistor gate realizations are shown in FIG. 2. In FIG. 2A, a truth table of 4 input variables, A, B, C & D is shown. By grouping the logic ones in the table, the output function can be expressed as AND & OR functions of inputs as shown by the logic equation in FIG. 2A. An exemplary MUX implementation of the logic function is shown in FIG. 2B. The MUX has 3-control variables A, B and C, and the fourth variable D together with D' (not D), logic one and logic zero are used as inputs to the MUX. The inputs can be hard-wired or provided as programmable options. The MUX comprises a plurality of pass-gates 201. For a 3-variable hard-wired MUX, only 14 pass-gates such as 201 are needed. This is a very efficient implementation of hard-wired logic. Any 4-variable truth table can be realized by the 3-control variable MUX as shown in FIG. 2B by wiring the input values accordingly. The inputs to a programmable MUX logic element can be provided as shown in FIG. 2C. There is considerable overhead to make the MUX inputs user programmable. In FIG. 2C, two programmable memory bits such as 202 per input are configured to couple the desired input value to $I_1$. Combining the two figures in FIGS. 2B & 2C, one can see that a 4-input programmable MUX utilizes 62 pass-gates such as 201 and 16 memory bits such as 202. For 6T CMOS SRAM memory, each memory bit occupies 4 NMOS gates and 2 PMOS gates. Hence a programmable 4-input MUX implementation takes up 158 transistors. In anti-fuse technology, each input wire connection can be built into a programmable anti-fuse between two metal lines. That requires only decoding transistors at the end of wire segments to program the anti-fuse elements, thus saving Silicon area. Hence a programmable MUX as shown in FIG. 2B is not popular for SRAM based FPGAs, whereas it is a logical choice for anti-fuse based FPGAs.

AND/OR realization of the logic function in FIG. 2A is shown in FIG. 2D. There are five 3-input AND gates and one 5-input OR gate to generate the required F output. In full CMOS implementation, each 3-input AND is 6 transistors, while 5-input OR is 10 transistors. Hence the AND/OR gate realization in FIG. 2D takes up 40 transistors. The Silicon area is also impacted by the latch-up related N-Well rules that mandate certain spacing restrictions between NMOS and PMOS transistors. For this example, the hard-wire MUX implementation took less gates compared to the hard-wire AND/OR gate implementation, while the programmable MUX took a considerable overhead.

Commercially available FPGAs use 3-input and 4-input look up tables (LUT). The more popular 4-input LUT implementation of the truth table in FIG. 2A is shown in FIG. 2E. Any 4-input function can be implemented in FIG. 2E by setting the LUT values. In this disclosure, we will name this a 4LUT, where the word input is dropped for convenience and the number of inputs is pre-fixed to the word LUT. The 4LUT has 16 LUT values, which can be hard-wired or programmable. LUT and MUX construction of logic elements are very similar and both are commercially used in FPGA & Gate Array products as shown in Ref-1 & Ref-2. There are 30 pass-gates (such as 201) in FIG. 2E for the hard-wire 4LUT. This 30 gate 4 LUT is larger than a 14 gate hard-wire MUX, but smaller than the 40 gate hard-wire AND/OR logic implementation. The 16 LUT values in the 4LUT determine the LUT function. Using 16 programmable registers such as 202 for these inputs allows the 4LUT to be user programmable. The 16 memory elements, in both programmable MUX and LUT options, utilize 96 extra transistors when implemented in 6T CMOS SRAM. Hence the programmable 4LUT with 126 transistors is more economical compared to the programmable MUX option with 158 transistors. Thus LUT logic is extensively used in SRAM based FPGAs while MUX logic is used in anti-fuse based FPGAs and Gate Arrays.

FPGA and Gate Array architectures are discussed in Carter U.S. Pat. No. 4,706,216, Freemann U.S. Pat. No. 4,870,302, ElGamal et al. U.S. Pat. No. 4,873,459, Freemann et al. U.S. Pat. No. 5,488,316 & U.S. Pat. 5,343,406, Trimberger et al. U.S. Pat. No. 5,844,422, Cliff et al. U.S. Pat. No. 6,134,173, Wittig et al. U.S. Pat. No. 6,208,163, Or-Bach US 2001/003428, Mendel U.S. Pat. No. 6,275,065, Lee et al. US 2001/0048320, Or-Bach U.S. Pat. No. 6,331, 789, Young et al. U.S. Pat. No. 6,448,808, Sueyoshi et al. US 2003/0001615, Agrawal et al. US 2002/0186044, Sugibayashi et al. U.S. Pat. No. 6,515,511 and Pugh et al. US 2003/0085733. These patents disclose programmable MUX and programmable LUT structures to build logic elements that are user configurable. In all cases a routing block is used to provide inputs and outputs for these logic elements, while the logic element is programmed to perform a specific logic function. The routing-block is a hard-wire connection for Gate Array and Structured ASIC devices. Within a logic element, each LUT is hard-wired to a specific size, said size determined by the number of LUT inputs. This LUT is the smallest building block in the logic element and cannot be sub-divided. As an example, a smaller 2-input logic function would occupy a 4LUT, if that is the smallest element available. That leads to Silicon utilization inefficiency. Within a logic block, multiple logic elements are grouped together in a pre-defined manner. The size of the logic block determines the granularity. As manufacturing geometries shrink, the FPGA granularity gets larger, the LUT size increases and the number of LUTs per logic block has to increase. Having a large fixed LUT in the logic element further aggravates the Silicon utilization efficiency and is not flexible for next generation FPGA designs.

As the LUT structure gets large, the logic porting becomes more difficult and Silicon utilization gets more inefficient. To illustrate LUT utilization efficiency, in FIG. 3 we provide the pass-gate construction required to build 1LUT, 2LUT, 3LUT, 4LUT and 5LUT logic elements. FIG. 3A shows a 1LUT comprising of two pass-gates 301 & 302, two LUT values contained in two programmable registers 303 & 304 and one input variable "A" in true and compliment. A 1LUT is simply a 2:1 MUX selecting one of two register values. Any 1-input function such as 2:1 MUX, Logic-1, Logic-0, TRUE and INVERT can be realized by this 1LUT by programming the two LUT values. Signal A allows the LUT values in either 303 or 304 to reach output F. There is a time delay for this to occur. That is a characteristic 1LUT delay time, which is optimized by sizing the transistors 301 and 302 as needed. Faster time requires wider transistors. The symbol for 1LUT is shown in FIG. 3B, and this symbol is used to illustrate higher LUT constructions in FIG. 3C thru FIG. 3F.

A 2LUT is shown in FIG. 3C that can realize any 2-input function such as AND, NAND, OR, NOR, XOR among others. As shown in FIG. 3C, the 2LUT can be constructed by hard-wiring three 1LUTs 311, 312 & 313 as shown. This is termed a LUT cone or a LUT tree and comprises two stages. First stage has 1LUT 311 and 312 sharing a common input, while second stage has 1LUT 313. Only the 1LUTs in the first stage 311 and 312 have LUT values. LUT outputs from first stage are fed as LUT values to second stage. These are hard-wire connections. In FIG. 3C, 1LUT outputs from 311 and 312 are fed as LUT values to 1LUT 313. A 2LUT delay comprises the time taken for a LUT value in the first stage to reach F. There are now two pass-gates in series, and this delay is larger than for a 1LUT. Thus the pass-gates need to be wider to reduce the LUT delay. That increase in area and slow down in performance hurt LUT logic trees. Similarly, 3LUT, 4LUT and 5LUT constructions with 1LUTs are shown in FIG. 3D, FIG. 3E and FIG. 3F respectively. Those pass-gates have to be even wider to improve LUT delays. The 5LUT in FIG. 3F has 16 1LUTs in the first stage, 8 1LUTs in the second stage, 4 1LUTs in the third stage, 2 1LUTs in the fourth stage and one 1LUT in the final fifth stage. A total of 31 1LUTs are used in FIG. 3F for the 5LUT construction. A K-LUT cone or a K-LUT tree has K-input variables, K-stages and $2^K$ LUT values to realize a K-input function. Each stage has one common input variable. $2^{(K-1)}$ outputs from first stage feed as LUT values into second stage. Consecutive LUT value reduction continues until the last stage, when only 2 LUT values feed the last stage, and one LUT output is obtained. The equivalent 1LUTs required to build a K-LUT is tabulated in FIG. 3G, and is shown to grow as $(2^K-1)$. Logic porting to K-LUT is discussed by Ahmed et al. (Ref-3) for multiple K values. They have looked at porting 20 benchmark logic designs into varying LUT sizes: 1LUT, 2LUT, 3LUT, 4LUT, 5LUT, 6LUT and 7LUT. The geometric average number of K-LUTs required for porting 20 designs, as shown in FIG. 10 in Ref-2, is tabulated in the first 2 columns of FIG. 4. As can be seen, as the size of the K-LUT increases, the total number of K-LUTs required to fit an average design decreases. In addition, FIG. 4 also lists the equivalent 1LUT per K-LUT (from FIG. 3G) in column 3, and calculates the equivalent 1LUTs required for the design in column 4. Column 4 values are obtained by multiplying values in column 2 by values in column 3. In FIG. 4, each row represents how many K-LUTs are required for an average design, and an equivalent 1LUT calculation as a measure of Silicon utilization. 2LUT implementation in row-1 needs only 12900 1LUTs, while the 7LUT implementation in row-6 needs 177800 1LUTs for the same design. The latter 7LUT has only 7.3% Silicon utilization efficiency compared to the former 2LUT. From row-3, commercially available FPGAs with 4LUTs are seen only 36.1% efficient compared to 2LUTs at fitting logic. As the LUT size gets larger, clearly a more efficient LUT circuit is needed to improve Silicon utilization in LUT based logic elements.

LUT based logic elements are used in conjunction with programmable point to point connections. Four exemplary methods of programmable point to point connections, synonymous with programmable switches, between node A and node B are shown in FIG. 5. A configuration circuit to program the connection is not shown in FIG. 5. All the patents listed under FPGA architectures use one or more of these basic programmable connections. In FIG. 5A, a conductive fuse link 510 connects A to B. It is normally connected, and passage of a high current or exposure to a laser beam will blow the conductor open. In FIG. 5B, a capacitive anti-fuse element 520 disconnects A from B. It is normally open, and passage of a high current will pop the insulator shorting the two terminals. Fuse and anti-fuse are both one time programmable due to the non-reversible nature of the change. In FIG. 5C, a pass-gate device 530 connects A to B. The gate signal $S_0$ determines the nature of the connection, on or off. This is a non destructive change. The gate signal is generated by manipulating logic signals, or by configuration circuits that include memory. The choice of memory varies from user to user. In FIG. 5D, a floating-pass-gate device 540 connects A to B. Control gate signal $S_0$ couples a portion of that to floating gate. Electrons trapped in the floating gate determines an on or off state for the connection. Hot-electrons and Fowler-Nordheim tunneling are two mechanisms for injecting charge to floating-gates. When high quality insulators encapsulate the floating gate, trapped charge stays for over 10 years. These provide non-volatile memory. EPROM, EEPROM and Flash memory employ floating-gates and are non-volatile. Anti-fuse and SRAM based architectures are widely used in commercial FPGA's, while EPROM, EEPROM, anti-fuse and fuse links are widely used in commercial PLD's. Volatile SRAM memory needs no high programming voltages, is freely available in every logic process, is compatible with standard CMOS SRAM memory, lends to process and voltage scaling and has become the de-facto choice for modern day very large FPGA device construction.

LUT based logic elements are used to implement carry logic. Such logic elements and logic blocks are disclosed in U.S. Pat. No. 5,274,581; U.S. Pat. No. 5,386,156; U.S. Pat. No. 5,481,486; U.S. Pat. No. 5,815,726; U.S. Pat. No. RE35,977; U.S. Pat. No. 5,926,036; U.S. Pat. No. 6,107,822; U.S. Pat. No. 6,271,680; U.S. Pat. No. 6,353,920; U.S. Pat. No. 6,807,556; U.S. Pat. No. 6,888,373; U.S. Pat. No. 6,937,064; U.S. Pat. No. 7,030,650; U.S. Pat. No. 7,061,268; U.S. Pat. No. 7,167,021; U.S. Pat. No. 7,111,214 and U.S. Pat. No. 7,193,433. Such implementations offer techniques for programmable fabrics to be configured to perform carry logic in addition to basic LUT based logic. In all cases, extra AND, XOR type gates are added to modify simple LUT structures to enable carry logic. When LUTs are not used for carry logic, which is most of the logic in programmable logic fabric, these extra gates are not used and extra Si is wasteful and costly to the user. When high input LUTs are used to compute fewer input functions, Si area is wasted. Implementation of carry logic comprises two key elements: total usage of logic blocks, and number stages for carry logic implementation. The first determines cost and the latter determines performance of carry function. For a LUT based logic block, it is further beneficial for most of the LUT gates to be occupied by the carry logic. Specifically McElvain in U.S. Pat. No. 6,807,556 discloses a method to parallelize carry chain implementation to reduce performance, but there is no improvement to cost (i.e. same number of logic elements as no-parallel implementation) as the LUT logic blocks are under-utilized. What is desirable is to achieve carry functions that add little to no extra overhead to typical non-carry based LUT logic elements, use fewer total LUT logic blocks to reduce cost and require fewer stages to improve performance over the best prior-art parallelized scheme in implementing carry logic functions in an FPGA. Specifically, a faster and cheaper incrementer/decrementer implementation (add a 1 to a data string comprising a word, subtract a 1 from a word) using LUT logic elements is highly desirable.

All commercially available high density FPGA's use SRAM memory elements. A volatile six transistor SRAM based configuration circuit is shown in FIG. 6A. The SRAM memory element can be any one of 6-transistor, 5-transistor, full CMOS, R-load or TFT PMOS load based cells to name a few. Two inverters 603 and 604 connected back to back forms the memory element. This memory element is a latch providing complementary outputs $S_0$ and $S_0$'. The latch can be constructed as full CMOS, R-load, PMOS load or any other. Power and ground terminals for the inverters are not shown in FIG. 6A. Access NMOS transistors 601 and 602, and access wires GA, GB, BL and BS provide the means to configure the memory element. Applying zero and one on BL and BS respectively, and raising GA and GB high enables writing zero into device 601 and one into device 602. The output $S_0$ delivers a logic one. Applying one and zero on BL and BS respectively, and raising GA and GB high enables writing one into device 601 and zero into device 602. The output $S_0$ delivers a logic zero. The SRAM construction may allow applying only a zero signal at BL or BS to write data into the latch. The SRAM cell may have only one access transistor 601 or 602. The SRAM latch will hold the data state as long as power is on. When the power is turned off, the SRAM bit needs to be restored to its previous state from an outside permanent memory. In the literature for programmable logic, this second non-volatile memory is also called configuration memory. Upon power up, an external or an internal CPU loads the external configuration memory to internal configuration memory locations. All of FPGA functionality is controlled by the internal configuration memory. The SRAM configuration circuit in FIG. 6A controlling logic pass-gate is illustrated in FIG. 6B. Element 650 represents the configuration circuit. The $S_0$ output directly driven by the memory element shown in FIG. 6A drives the pass-gate 610 gate electrode. In addition to $S_0$ output and the memory cell, power, ground, data-in and write-enable signals in 650 constitutes the SRAM configuration circuit. Write enable circuitry includes GA, GB, BL, BS signals shown in FIG. 6A.

As discussed earlier, providing programmability is a very severe transistor and cost penalty compared to hard-wired Gate Array or ASIC implementation of identical logic. A significant factor in the penalty comes from the 6-transistors required for the configuration circuits. The natural conclusion is to minimize the number of configurable bits used in the programmable logic element. This mandates constructing a hard-wired larger 6LUT or a bigger LUT for next generation FPGAs. We have shown that Silicon utilization is severely impacted with this move towards larger LUT structures in logic elements. What is desirable is to have an economical and flexible LUT macro-cell, or a macro-LUT circuit. This LUT macro-cell should efficiently implement logic functions. Both large logic functions that port to one big LUT and small logic functions that port to multiple smaller LUTs should fit easily into a LUT macro-cell. Furthermore, LUT logic packing should maximize Silicon utilization to keep programmable logic cost reasonable with other hard-wired IC manufacturing choices. The user should be able to take a synthesized netlist from an ASIC flow, typically comprising smaller logic blocks, convert this netlist to fit in the FPGA granularity, place and route logic economically and efficiently. This would make use of existing third party ASIC tools at the front-end logic design and streamline tool flow for FPGA place & routing.

For an emulation device, the cost of programmability is not the primary concern if such a device provides a migration path to a lower cost. Today an FPGA migration to a Gate Array requires a new design to ensure timing closure. A desirable migration path is to keep the timing of the original FPGA design intact That would avoid valuable re-engineering time, opportunity costs and time to solution (TTS). Such a conversion should occur in the same base die to avoid Silicon and system requalification costs and implementation delays. Such a conversion should also realize an end product that is competitive with an equivalent standard cell ASIC or a Gate Array product in cost and performance. Such an FPGA device will also target applications that are cost sensitive, have short life cycles and demand high volumes.

SUMMARY

In one aspect, a programmable look up table (LUT) circuit for an integrated circuit comprises: one or more secondary inputs; and one or more configurable logic states; and two or more LUT values; and a programmable means to select a LUT value from a secondary input or a configurable logic state.

Implementations of the above aspect may include one or more of the following. A semiconductor integrated circuit comprises an array of programmable modules. Each module may use one or more LUT or MUX based logic elements. A programmable interconnect structure may be used to interconnect these programmable modules in an FPGA device. A logic design may be specified by the user in VHDL or Verilog design input language and synthesized to a gate-level netlist description. This synthesized netlist is ported into logic blocks and connected by the routing block in the FPGA. Each large LUT in a module may be comprised of a smaller 1-input LUT (1LUT) cone, known also as a 1LUT tree. A Larger LUT may be comprised of smaller 2LUT, or 3LUT trees. A smaller LUT provides added flexibility in fitting logic. A smaller LUT provides at least one LUT value to be selected from either a programmable register or from an input. The input may be an output of a previously generated logic function, or an external input. The registers may be user configurable to logic zero and logic one states. The larger LUT and smaller LUT may comprise a programmable switch to connect two points. Most common switch is a pass-gate device. A pass-gate is an NMOS transistor, or a PMOS transistor or a CMOS transistor pair that can electrically connect two points. Other methods of connecting two points include fuse links and anti-fuse capacitors, among others. Programming these devices include forming one of either a conducting path or a non-conducting path in the connecting device. These pass-gates may be fabricated in a first module layer, said module comprising a Silicon substrate layer.

The LUT circuits may include digital circuits consisting of CMOS transistors forming AND, NAND, INVERT, OR, NOR and pass-gate type logic circuits. Configuration circuits are used to change LUT values, functionality and connectivity. Configuration circuits have memory elements and access circuitry to change stored memory data. Memory elements can be RAM or ROM. Each memory element can be a transistor or a diode or a group of electronic devices. The memory elements can be made of CMOS devices, capacitors, diodes, resistors, wires and other electronic components. The memory elements can be made of thin film devices such as thin film transistors (TFT), thin-film capacitors and thin-film diodes. The memory element can be selected from the group consisting of volatile and non volatile memory elements. The memory element can also be selected from the group comprising fuses, antifuses, SRAM cells, DRAM cells, optical cells, metal optional links, EPROMs, EEPROMs, flash, magnetic, electro-chemical and ferro-electric elements. One or more redundant memory elements can be provided for controlling the same circuit block. The memory element can generate an output signal to control pass-gate logic. Memory element may generate a signal that is used to derive a control signal to control pass-gate logic. The control signal is coupled to MUX or Look-Up-Table (LUT) logic element.

LUT circuits are fabricated using a basic logic process used to build CMOS transistors. These transistors are formed on a P-type, N-type, epi or SOI substrate wafer. Configuration circuits, including configuration memory, constructed on same Silicon substrate take up a large Silicon foot print. That adds to the cost of programmable LUT circuits compared to similar functionality custom wire circuits. A 3-dimensional integration of configuration circuits described in incorporated references provides a significant cost reduction in programmability. The configuration circuits may be constructed after a first contact layer is formed or above one or more metal layers. The programmable LUT may be constructed as logic circuits and configuration circuits. The configuration circuits may be formed vertically above the logic circuits by inserting a thin-film transistor (TFT) module. The TFT module may include one or more metal layers for local interconnect between TFT transistors. The TFT module may include salicided poly-Silicon local interconnect lines and thin film memory elements. The thin-film module may comprise thin-film RAM elements. The thin-film memory outputs may be directly coupled to gate electrodes of LUT pass-gates to provide programmability. Contact or via thru-holes may be used to connect TFT module to underneath layers. The thru-holes may be filled with Titanium-Tungsten, Tungsten, Tungsten Silicide, or some other refractory metal. The thru-holes may contain Nickel to assist Metal Induced Laser Crystallization (MILC) in subsequent processing. Memory elements may include TFT transistors, capacitors and diodes. Metal layers above the TFT layers may be used for all other routing. This simple vertically integrated pass-gate switch and configuration circuit reduces programmable LUT cost.

In a second aspect, a programmable look up table circuit for an integrated circuit comprises: M primary inputs, wherein M is an integer value greater than or equal to one, and each said M inputs received in true and compliment logic levels; and $2^M$ secondary inputs; and $2^M$ configurable logic states, each said state comprising a logic zero and a logic one; and $2^M$ LUT values; and a programmable means to select each of said LUT values from a secondary input or a configurable logic state.

Implementations of the above aspect may include one or more of the following. A larger N-LUT is constructed with all equal size smaller K-LUTs. A larger N-LUT is constructed with unequal sized smaller K-LUTs. Each smaller K-LUT is constructed as a 1LUT, 2LUT, 3LUT up to (N-1)-LUT. The N-LUT is constructed as a K-LUT tree. Each stage in the N-LUT tree comprises a plurality of K-LUTs. Each K-LUT has one output. Larger N-LUT has one or more outputs comprising a plurality of smaller K-LUT outputs. Each K-LUT is also constructed as a 1LUTs tree. All primary K-LUTs (the first set of K-LUTs) in the N-LUT tree may have only configurable logic states for LUT values. All primary K-LUTs may a have a LUT value selected from an input and a configurable logic state. Said input may comprise an external input, a feed-back signal, a memory output or a control signal. Secondary K-LUT in the N-LUT tree provides a programmable connection between previous K-LUT outputs and configurable logic states. This hierarchical K-LUT arrangement is termed herein a LUT macrocell circuit. A LUT macrocell provides programmability to implement logic as one large N-LUT or as multiple smaller K-LUTs. Such division in logic implementation allows more logic to fit in a single LUT macrocell. It provides course-grain architecture with fine-grain logic fitting capability. More logic fitting improves Silicon utilization. In one embodiment, the smaller K-LUTs are implemented as 1LUTs. In a second embodiment the smaller K-LUTs are implemented as 2LUTs. In yet another embodiment the smaller K-LUTs are implemented as 3LUTs. A 1LUT in the first stage of a secondary K-LUT is used to combine two outputs from prior K-LUTs.

In a third aspect, a programmable macro look up table (macro-LUT) circuit for an integrated circuit, comprises: a plurality of LUT circuits, each of said LUT circuits comprising a LUT output, at least one LUT input, and at least two LUT values; and a programmable means of selecting LUT inputs to at least one of said LUT circuits from one or more other LUT circuit outputs and external inputs, and selecting LUT values to at least one of said LUT circuits from one or more other LUT circuit outputs and configurable logic states, said programmable means further comprised of two selectable manufacturing configurations, wherein: in a first selectable configuration, a random access memory circuit (RAM) is formed, said memory circuit further comprising configurable thin-film memory elements; in a second selectable configuration, a hard-wire read only memory circuit (ROM) is formed in lieu of said RAM, said ROM duplicating one RAM pattern in the first selectable option.

In a fourth aspect a programmable macro LUT structure adapted for carry logic incrementer/decrementer implementation in an integrated circuit, comprising: three or more data inputs and a carry-in input, said data inputs comprised of consecutive bits in a data string, said carry-in comprised of the increment value to the least order bit of said data string; and three or more data outputs and a carry-out output, said data outputs comprised of the incremented values of said data inputs, and said carry-out resulting from the incremented value of the highest order bit of said data inputs; wherein, said three or more data outputs are computed in a single carry computation stage within the LUT structure. Such an incrementer/decrementer further computes three or more bits of data within a single LUT structure within one carry computation cycle thus requiring fewer logic blocks and a higher computation speed over prior art.

Implementations of the above aspects may include one or more of the following. A programmable macro-LUT is used for a user to customize logic in an FPGA. This programmability is provided to the user in an off the shelf FPGA product. There is no waiting and time lost to port synthesized logic design into a macro-LUT circuit. This reduces time to solution (TTS) by 6 moths to over a year. The macro-LUT can be sub-divided into smaller LUT circuits. Each smaller LUT is comprised of 1LUTs. A portion of macro-LUT inputs and LUT values are selected by a programmable method. This allows prior LUT output logic manipulation. Macro-LUT inputs are selected from external inputs or other LUT outputs. LUT values are selected from external inputs, other LUT outputs or configurable logic states. Macro-LUT is very flexible in fitting one large logic block or many smaller logic blocks. Macro-LUT improves Silicon utilization. Macro-LUT improves run-times of a software tool that ports logic designs into FPGA. Macro-LUT improves routability. The Macro-LUT is constructed with RAM and ROM options.

Implementations of the above aspects may include one or more of the following. A programmable method includes customizing programmable LUT choices. This may be done by the user, wherein the macro-LUT comprises configuration circuits, said circuits including memory elements. Configuration circuits may be constructed in a second module, substantially above a first module comprising LUT pass-gate transistors. Configuration memory is built as Random Access Memory (RAM). User may customize the RAM module to program the LUT connections. The RAM circuitry may be confined to a thin-film transistor (TFT) layer in the second module. This TFT module may be inserted to a logic process. Manufacturing cost of TFT layers add extra cost to the finished product. This cost makes a programmable LUT less attractive to a user who has completed the programming selection. Once the programming is finalized by the user, the LUT connections and the RAM bit pattern is fixed for most designs during product life cycle. Programmability in the LUT circuit is no longer needed and no longer valuable to the user. The user may convert the design to a lower cost hard-wire ROM circuit. The programmed LUT choices are mapped from RAM to ROM. RAM outputs at logic one are mapped to ROM wires connected to power. RAM outputs at logic zero are mapped to ROM wires connected to ground. This may be done with a single metal mask in lieu of all of the TFT layers. Such an elimination of processing layers reduces the cost of the ROM version. A first module with macro-LUT transistors does not change by this conversion. A third module may exist above the second module to complete interconnect for functionality of the end device. The third module also does not change with the second module option. A timing characteristic comprising signal delay for LUT values to reach LUT output is not changed by the memory option. The propagation delays and critical path timing in the FPGA may be substantially identical between the two second module options. The TFT layers may allow a higher power supply voltage for the user to emulate performance at reduced pass-gate resistances. Such emulations may predict potential performance improvements for TFT pass-gates and hard-wired connected options. Duplicated ROM pattern may be done with a customized thru-hole mask. Customization may be done with a thru-hole and a metal mask or a plurality of thru-hole and metal masks. Hard wire pattern may also improve reliability and reduce defect density of the final product. The ROM pattern provides a cost economical final macro-LUT circuit to the user at a very low NRE cost. The total solution provides a programmable and customized solution to the user.

Implementations of the above aspects may further include one or more of the following. The programmable LUT circuit comprises a RAM element that can be selected from the group consisting of volatile or non volatile memory elements. The memory can be implemented using a TFT process technology that contains one or more of Fuses, Anti-fuses, DRAM, EPROM, EEPROM, Flash, Ferro-Electric, optical, magnetic, electro-chemical and SRAM elements. Configuration circuits may include thin film elements such as diodes, transistors, resistors and capacitors. The process implementation is possible with any memory technology where the programmable element is vertically integrated in a removable module. The manufacturing options include a conductive ROM pattern in lieu of memory circuits to control the logic in LUT circuits. Multiple memory bits exist to customize wire connections inside macro-LUTs, inside a logic block and between logic blocks. Each RAM bit pattern has a corresponding unique ROM pattern to duplicate the same functionality.

The programmable LUT structures described constitutes fabricating a VLSI IC product. The IC product is re-programmable in its initial stage with turnkey conversion to a one mask customized ASIC. The IC has the end ASIC cost structure and initial FPGA re-programmability. The IC product offering occurs in two phases: the first phase is a generic FPGA that has re-programmability contained in a programmable LUT and programmable wire circuit, and a second phase is an ASIC that has the entire programmable module replaced by one or two customized hard-wire masks. Both FPGA version and turnkey custom ASIC has the same base die. No re-qualification is required by the conversion. The vertically integrated programmable module does not consume valuable Silicon real estate of a base die. Furthermore, the design and layout of these product families adhere to removable module concept: ensuring the functionality and timing of the product in its FPGA and ASIC canonicals. These IC products can replace existing PLD's, CPLD's, FPGA's, Gate Arrays, Structured ASIC's and Standard Cell ASIC's. An easy turnkey customization of an end ASIC from an original smaller cheaper and faster programmable structured array device would greatly enhance time to market, performance, product reliability and solution cost.

BRIEF DESCRIPTION OF THE DRAWINGS

FIG. 2A shows a truth table for a four variable function and the logic equation.

FIG. 2B shows a 3-control-variable MUX realization of the function shown in FIG. 2A.

FIG. 2C shows a MUX input connection for a programmable version of MUX in FIG. 2B.

FIG. 2D shows an AND/OR gate realization of the function shown in FIG. 2A.

FIG. 3A & 3B show an exemplary one input LUT (1LUT) and the symbol used for it.

FIG. 3C-FIG. 3F show exemplary 2LUT, 3LUT, 4LUT and 5LUT respectively.

FIG. 3G shows the number of 1LUTs needed to construct a K-LUT (K is an integer from 1 to 7).

FIG. 4 shows Silicon utilization efficiency with K-LUTs, extracted from FIG. 10 in Ref-3.

FIG. 5A shows an exemplary fuse link point to point connection.

FIG. 5B shows an exemplary anti-fuse point to point connection.

FIG. 5C shows an exemplary pass-gate point to point connection.

FIG. 5D shows an exemplary floating-pass-gate point to point connection.

FIG. 6A shows an exemplary configuration circuit for a 6T SRAM element.

FIG. 6B shows an exemplary programmable pass-gate switch with SRAM memory.

FIG. 13A & 13B show a fourth & fifth embodiment of a novel programmable 1LUT.

FIG. 14 shows a novel programmable 2LUT macro-cell.

FIG. 18A shows a truth table and logic equation of an example.

FIG. 18B shows a 2LUT gate realization of the logic function in FIG. 18A.

FIG. 18C shows a 4LUT gate realization of the logic function in FIG. 18B.

FIG. 21A & 21B show a subtracter functional equations & truth table respectively.

FIG. 22A & 22B show an n-bit parity checker block diagram & equations.

FIG. 23A & 23B show two n-bit word comparator block diagram & functional equations.

FIG. 24A & 24B show prior art incrementer implementations using LUT logic.

FIG. 25A, 25B & 25C show novel incrementer implementations using LUT logic.

DESCRIPTION

Figure 1A:
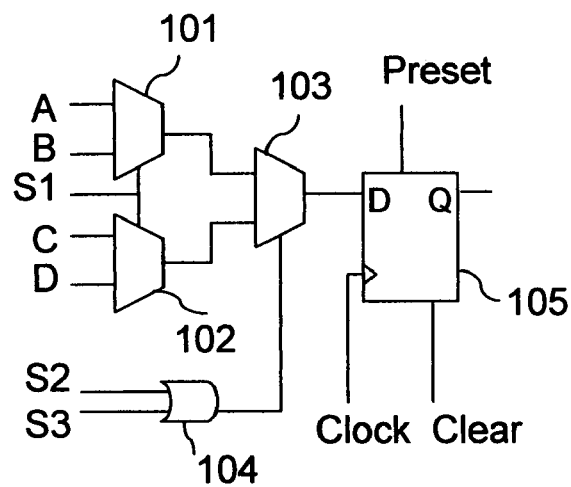
FIG. 1A shows an exemplary MUX or LUT based logic element.

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Definitions: The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, SOI material as well as other semiconductor structures well known to one skilled in the art. The term conductor is understood to include semiconductors, and the term insulator is defined to include any material that is less electrically conductive than the materials referred to as conductors.

The term module layer includes a structure that is fabricated using a series of predetermined process steps. The boundary of the structure is defined by a first step, one or more intermediate steps, and a final step. The resulting structure is formed on a substrate.

The term pass-gate refers to a structure that can pass a signal when on, and blocks signal passage when off. A pass-gate connects two points when on, and disconnects two points when off. A pass-gate can be a floating-gate transistor, an NMOS transistor, a PMOS transistor or a CMOS transistor pair. A pass-gate can be an electrolytic cell. In one embodiment, the gate electrode of pass-gate determines the state of the connection. A CMOS pass-gate requires complementary signals coupled to NMOS and PMOS gate electrodes. A control logic signal is connected to gate electrode of a pass-gate for programmable logic. In another embodiment a gate-electrode may used to configure a pass-gate between the on and off conditions. A programming voltage may be applied to configure the pass-gate to a pre-established state. The on, off conditions may be induced by altering the properties of the materials used to construct the pass-gate element.

The term configuration circuit includes one or more configurable elements and connections that can be programmed to control one or more circuit blocks in accordance with a predetermined user-desired functionality. The configuration circuit includes the memory element and the access circuitry, herewith called memory circuitry, to modify said memory element. Configuration circuit does not include the logic pass-gate controlled by said memory element. In one embodiment, the configuration circuit includes a plurality of RAM circuits to store instructions to configure an FPGA. In another embodiment, the configuration circuit includes a first selectable configuration where a plurality of RAM circuits is formed to store instructions to control one or more circuit blocks. The configuration circuits include a second selectable configuration with a predetermined ROM conductive pattern formed in lieu of the RAM circuit to control substantially the same circuit blocks. The memory circuit includes elements such as diode, transistor, resistor, capacitor, metal link, wires, among others. The memory circuit also includes thin film elements. In yet another embodiment, the configuration circuits include a predetermined conductive pattern, contact, via, resistor, capacitor or other suitable circuits formed in lieu of the memory circuit to control substantially the same circuit blocks.

The term "horizontal" as used in this application is defined as a plane parallel to the conventional plane or surface of a wafer or substrate, regardless of the orientation of the wafer or substrate. The term "vertical" refers to a direction perpendicular to the horizontal direction as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense.

The term look up table structure, LUT structure, LUT and LUT circuit are used for a look up table logic circuit. A LUT structure includes a LUT cone or a LUT tree. A LUT structure includes a 2:1 multiplexer. A LUT structure comprises a plurality of 2:1 multiplexer elements. A LUT structure includes NMOS, PMOS and CMOS transistors, and other circuit elements required to construct the LUT circuit. A LUT structure includes thin-film transistors, and 2D/3D arrangements of circuit elements. A LUT structure includes a pass-gate. A LUT structure includes inputs, outputs and data values. A LUT structure includes LUT stages. A LUT stage is defined as one or more 2:1 multiplexer elements in a LUT structure sharing a primary input. Primary inputs may be received by the LUT structure in true and compliment forms. The term K-LUT refers to a look up table comprising K inputs. A LUT value is defined as the look up table value read by the inputs. True and compliment nature of the primary signal will allow one of two LUT values in the 2:1 multiplexer element input to couple to the output. A K-LUT comprises $2^K$ LUT values, and at least one output. For a given combination of K-input values, a LUT value is received at said at least one LUT output. When K=1, the 1-LUT is a 2:1 multiplexer. A LUT stage comprising a plurality of 2:1 multiplexers also comprises a plurality of outputs. The terms LUT tree and LUT cone refers to the construction of a LUT structure, wherein there is a gradual decrease in the number of multiplexers in each stage. A first of the K-inputs is common to all the multiplexers in a first stage, a second of the K-inputs is common to all the multiplexers in a second stage and so on until the last LUT stage is reached in a hard wired K-LUT tree. The LUT stages in between the first LUT stage and last LUT stage are defined as intermediate LUT stages.

Programmable LUTs use point to point connections that utilize programmable pass-gate logic as shown in FIG. 6A and FIG. 6B. Multiple inputs (node A) can be connected to multiple outputs (node B) with a plurality of pass-gate logic elements. The SRAM base connection shown in FIG. 6 may have pass-gate 610 as a PMOS or an NMOS transistor. NMOS is preferred due to its higher conduction. The voltage $S_0$ on NMOS transistor 610 gate electrode determines an ON or OFF connection. That logic level is generated by a configuration circuit 650 coupled to the gate of NMOS transistor 610. The pass-gate logic connection requires the configuration circuitry to generate signal $S_0$ with sufficient voltage levels to ensure off and on conditions. For an NMOS pass-gate, $S_0$ having a logic level one completes the point to point connection, while a logic level zero keeps them disconnected. In addition to using only an NMOS gate, a PMOS gate could also be used in parallel to make the connection. The configuration circuit 650 needs to then provide complementary outputs ($S_0$ and $S_0'$) to drive NMOS and PMOS gates in the connection. Configuration circuit 650 contains a memory element. Most CMOS SRAM memory delivers complementary outputs. This memory element can be configured by the user to select the polarity of $S_0$, thereby selecting the status of the connection. The memory element can be volatile or non-volatile. In volatile memory, it could be DRAM, SRAM, Optical or any other type of a memory device that can output a valid signal $S_0$. In non-volatile memory it could be fuse, anti-fuse, EPROM, EEPROM, Flash, Ferro-Electric, Magnetic or any other kind of memory device that can output a valid signal $S_0$. The output $S_0$ can be a direct output coupled to the memory element, or a derived output in the configuration circuitry. An inverter can be used to restore $S_0$ signal level to full rail voltage levels. The SRAM in configuration circuit 650 can be operated at an elevated Vcc level to output an elevated $S_0$ voltage level. This is especially feasible when the SRAM is built in a separate TFT module. Other configuration circuits to generate a valid $S_0$ signal are discussed next.

Figure 7:
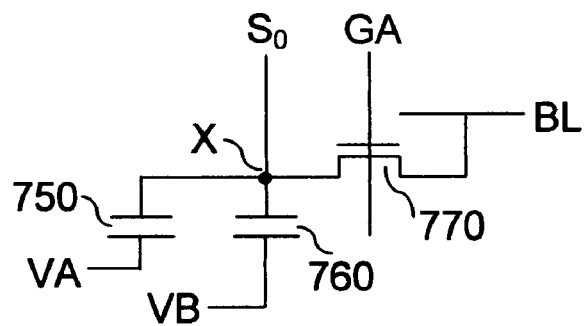
FIG. 7 shows an anti-fuse based configuration circuit.

An anti-fuse based configuration circuit to use with this invention is shown next in FIG. 7. Configuration circuit 650 in FIG. 6B can be replaced with the anti-fuse circuit shown in FIG. 7. In FIG. 7, output level $S_0$ is generated from node X which is coupled to signals VA and VB via two anti-fuses 750 and 760 respectively. Node X is connected to a programming access transistor 770 controlled by gate signal GA and drain signal BL. A very high programming voltage is needed to blow the anti-fuse capacitor. This programming voltage level is determined by the anti-fuse properties, including the dielectric thickness. Asserting signal VA very high, VB low (typically ground), BL low and GA high (Vcc to pass the ground signal) provides a current path from VA to BL through the on transistor 770. A high voltage is applied across anti-fuse 750 to pop the dielectric and short the terminals. Similarly anti-fuse 760 can be programmed by selecting VA low, VB very high, BL low and GA high. Only one of the two anti-fuses is blown to form a short. When the programming is done, BL and GA are returned to zero, isolating node X from the programming path. VA=Vss (ground) and VB=Vcc (power, or elevated Vcc) is applied to the two signal lines. Depending on the blown fuse, signal $S_0$ will generate a logic low or a logic high signal. This is a one time programmable memory device. Node X will be always connected to VA or VB by the blown fuse regardless of the device power status. Signals GA and BL are constructed orthogonally to facilitate row and column based decoding to construct these memory elements in an array.

Figure 8A:
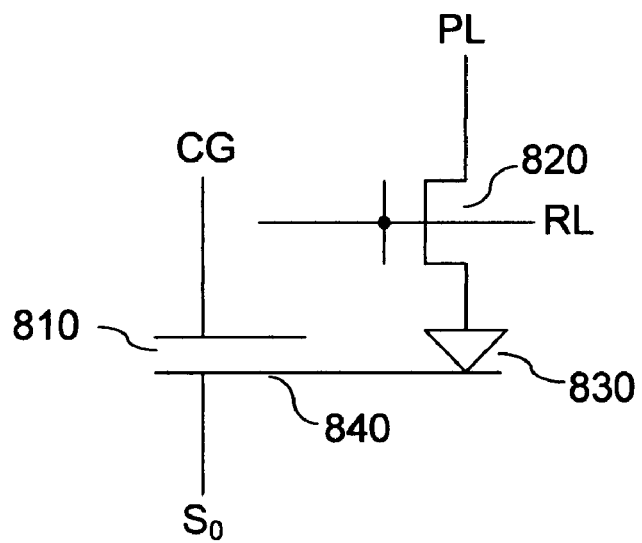
FIG. 8A shows a first embodiment of a floating gate configuration circuit.
Figure 8B:
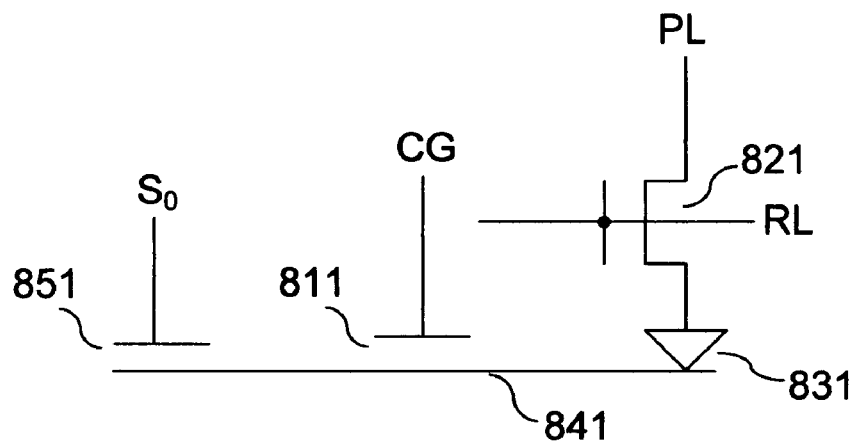
FIG. 8B shows a second embodiment of a floating gate configuration circuit.

FIG. 8 shows two EEPROM non-volatile configuration circuits that can be used in this invention. Configuration circuit 650 in FIG. 6B can be replaced with either of two EEPROM circuit shown in FIG. 8A and FIG. 8B. In FIG. 8A, node 840 is a floating gate. This is usually a poly-Silicon film isolated by an insulator all around. It is coupled to the source end of programming transistor 820 via a tunneling diode 830. The tunneling diode is a thin dielectric capacitor between floating poly and substrate Silicon with high doping on either side. When a large programming (or erase) voltage Vpp is applied across the thin dielectric, a Fowler-Nordheim tunneling current flows through the oxide. The tunneling electrons move from electrical negative to electrical positive voltage. Choosing the polarity of the applied voltage across the tunneling dielectric, the direction of electron flow can be reversed. Multiple programming and erase cycles are possible for these memory elements. As the tunneling currents are small, the high programming voltage (Vpp) can be generated on chip, and the programming and erasure can be done while the chip is in a system. It is hence called in system programmable (ISP). An oxide or dielectric capacitor 810 couples the floating gate (FG) 840 to a control gate (CG). The control gate CG can be a heavily doped Silicon substrate plate or a second poly-Silicon plate above the floating poly. The dielectric can be oxide, nitride, ONO or any other insulating material. A voltage applied to CG will be capacitively coupled to FG node 840. The coupling ratio is designed such that 60-80 percent of CG voltage will be coupled to FG node 840. To program this memory element, a negative charge must be trapped on the FG 840. This is done by applying positive Vpp voltage on CG, ground voltage on PL and a sufficiently high (Vcc) voltage on RL. CG couples a high positive voltage onto FG 840 creating a high voltage drop across diode 830. Electrons move to the FG 840 to reduce this electric field. When the memory device is returned to normal voltages, a net negative voltage remains trapped on the FG 840. To erase the memory element, the electrons must be removed from the floating gate. This can be done by UV light, but an electrical method is more easily adapted. The CG is grounded, a very high voltage (Vpp+more to prevent a threshold voltage drop across 820) is applied to RL, and a very high voltage (Vpp) is applied to PL. Now a low voltage is coupled to FG with a very high positive voltage on the source side of device 820. Diode 830 tunneling removes electrons from FG. This removal continues beyond a charge neutral state for the isolated FG. When the memory device is returned to normal voltages, a net positive voltage remains trapped on the FG 840. Under normal operation RL is grounded to isolate the memory element from the programming path, and PL is grounded. A positive intermediate voltage Vcg is applied to CG terminal. FG voltage is denoted $S_0$. Under CG bias, $S_0$ signal levels are designed to activate pass-gate logic correctly. Configuration circuit in FIG. 8B is only different to that in FIG. 8A by the capacitor 851 used to induce $S_0$ voltage. This is useful when $S_0$ output is applied to leaky pass-gates, or low level leakage nodes. As gate oxide thicknesses reach below 50 angstroms, the pass-gates leak due to direct tunneling.

These configuration circuits, and similarly constructed other configuration circuits, can be used in programmable logic devices. Those with ordinary skill in the art may recognize other methods for constructing configuration circuits to generate a valid $S_0$ output. The pass-gate logic element is not affected by the choice of the configuration circuit.

SRAM memory technology has the advantage of not requiring a high voltage to configure memory. The SRAM based switch shown in FIG. 6B containing the SRAM memory circuit shown in FIG. 6A utilizes 6 extra configuration transistors, discounting the pass-gate 610, to provide the programmability. That is a significant overhead compared to application specific and hard-wired gate array circuits where the point to point connection can be directly made with metal. Similarly other programmable memory elements capable of configuring pass-gate logic also carry a high Silicon foot print. A cheaper method of constructing a vertically integrated SRAM cell is described in incorporated by reference application Ser. No. 10/413,810. In a preferred embodiment, the configuration circuit is built on thin-film semiconductor layers located vertically above the logic circuits. The SRAM memory element, a thin-film transistor (TFT) CMOS latch as shown in FIG. 6A, comprises two lower performance back to back inverters formed on two semiconductor thin film layers, substantially different from a first semiconductor single crystal substrate layer and a gate poly layer used for logic transistor construction. This latch is stacked above the logic circuits for slow memory applications with no penalty on Silicon area and cost. This latch is adapted to receive power and ground voltages in addition to configuration signals. The two programming access transistors for the TFT latch are also formed on thin-film layers. Thus in FIG. 6B, all six configuration transistors shown in 650 are constructed in TFT layers, vertically above the pass transistor 610. Transistor 610 is in the conducting path of the connection and needs to be a high performance single crystal Silicon transistor. This vertical integration makes it economically feasible to add an SRAM based configuration circuit at a very small cost overhead to create a programmable solution. Such vertical integration can be extended to all other memory elements that can be vertically integrated above logic circuits.

A new kind of a programmable logic device utilizing thin-film transistor configurable circuits is disclosed in incorporated by reference application Ser. No. 10/267,483, application Ser. No. 10/267,484 and application Ser. No. 10/267,511. The disclosures describe a programmable logic device and an application specific device fabrication from the same base Silicon die. The PLD is fabricated with a programmable RAM module, while the ASIC is fabricated with a conductive ROM pattern in lieu of the RAM. Both RAM module and ROM module provide identical control of logic circuits. For each set of RAM bit patterns, there is a unique ROM pattern to achieve the same logic functionality. The vertical integration of the configuration circuit leads to a significant cost reduction for the PLD, and the elimination of TFT memory for the ASIC allows an additional cost reduction for the user. The TFT vertical memory integration scheme is briefly described next.

Figure 9:
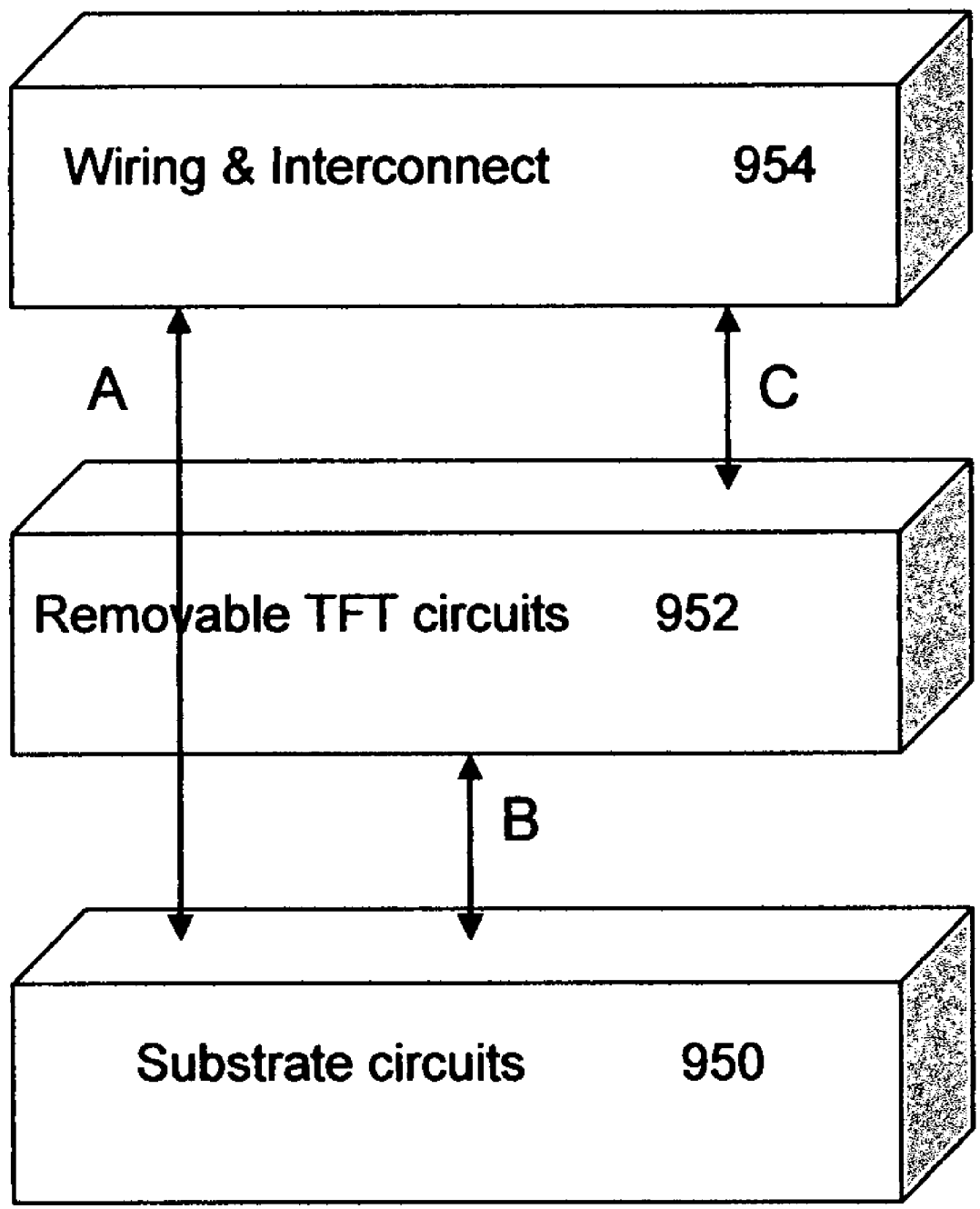
FIG. 9 shows a modular construction of a LUT circuit with removable TFT layers.

FIG. 9 shows an implementation of vertically integrated circuits, where the configuration memory element is located above logic. The memory element can be any one of fuse links, anti-fuse capacitors, SRAM cells, DRAM cells, metal optional links, EPROM cells, EEPROM cells, flash cells, ferro-electric elements, electro-chemical elements, optical elements and magnetic elements that lend to this implementation. SRAM memory is used herein to illustrate the scheme and is not to be taken in a limiting sense. First, Silicon transistors 950 are deposited on a substrate. A module layer of removable SRAM cells 952 are positioned above the Silicon transistors 950, and a module layer of interconnect wiring or routing circuit 954 is formed above the removable memory cells 952. To allow this replacement, the design adheres to a hierarchical layout structure. As shown in FIG. 9, the SRAM cell module is sandwiched between the single crystal device layers below and the metal layers above electrically connecting to both. It also provides through connections "A" for the lower device layers to upper metal layers. The SRAM module contains no switching electrical signal routing inside the module. All such routing is in the layers above and below. Most of the programmable element configuration signals run inside the module. Upper layer connections to SRAM module "C" are minimized to Power, Ground and high drive data wires. Connections "B" between SRAM module and single crystal module only contain logic level signals and replaced later by Vcc and Vss wires. Most of the replaceable programmable elements and its configuration wiring is in the "replaceable module" while all the devices and wiring for the end ASIC is outside the "replaceable module". In other embodiments, the replaceable module could exist between two metal layers or as the top most module layer satisfying the same device and routing constraints. This description is equally applicable to any other configuration memory element, and not limited to SRAM cells.

Fabrication of the IC also follows a modularized device formation. Formation of transistors 950 and routing 954 is by utilizing a standard logic process flow used in the ASIC fabrication. Extra processing steps used for memory element 952 formation are inserted into the logic flow after circuit layer 950 is constructed. A full disclosure of the vertical integration of the TFT module using extra masks and extra processing is in the incorporated by reference applications listed above.

During the ROM customization, the base die and the data in those remaining mask layers do not change making the logistics associated with chip manufacture simple. Removal of the SRAM module provides a low cost standard logic process for the final ASIC construction with the added benefit of a smaller die size. The design timing is unaffected by this migration as lateral metal routing and Silicon transistors are untouched. Software verification and the original FPGA design methodology provide a guaranteed final ASIC solution to the user. A full disclosure of the ASIC migration from the original FPGA is in the incorporated by reference applications discussed above.

In FIG. 9, the third module layer is formed substantially above the first and second module layers, wherein interconnect and routing signals are formed to connect the circuit blocks within the first and second module layers. Alternatively, the third module layer can be formed substantially below the first and second module layer with interconnect and routing signals formed to connect the circuit blocks within the first and second module layers. Alternatively, the third and fourth module layers positioned above and below the second module layer respectively, wherein the third and fourth module layers provide interconnect and routing signals to connect the circuit blocks within the first and second module layers.

In yet another embodiment of a programmable multi-dimensional semiconductor device, a first module layer is fabricated having a plurality of circuit blocks formed on a first plane. The programmable multi-dimensional semiconductor device also includes a second module layer formed on a second plane. A plurality of configuration circuits is then formed in the second plane to store instructions to control a portion of the circuit blocks.

The fabrication of thin-film transistors to construct configuration circuits is discussed next. A full disclosure is provided in incorporated by reference application Ser. No. 10/413,809. The following terms used herein are acronyms associated with certain manufacturing processes. The acronyms and their abbreviations are as follows:

$V_T$ Threshold voltage
LDN Lightly doped NMOS drain
LDP Lightly doped PMOS drain
LDD Lightly doped drain
RTA Rapid thermal annealing
Ni Nickel
Co Cobalt
Ti Titanium
TiN Titanium-Nitride
W Tungsten
S Source
D Drain
G Gate
ILD Inter layer dielectric
C1 Contact-1
M1 Metal-1
P1 Poly-1
P− Positive light dopant (Boron species, $BF_2$)
N− Negative light dopant (Phosphorous, Arsenic)
P+ Positive high dopant (Boron species, $BF_2$)
N+ Negative high dopant (Phosphorous, Arsenic)
Gox Gate oxide
C2 Contact-2
LPCVD Low pressure chemical vapor deposition
CVD Chemical vapor deposition
ONO Oxide-nitride-oxide
LTO Low temperature oxide A logic process is used to fabricate CMOS devices on a substrate layer for the fabrication of logic circuits. These CMOS devices may be used to build AND gates, OR gates, inverters, adders, multipliers, memory and pass-gate based logic functions in an integrated circuit. A CMOSFET TFT module layer or a Complementary gated FET (CGated-FET) TFT module layer may be inserted to a logic process at a first contact mask to build a second set of TFT MOSFET or Gated-FET devices. Configuration circuitry including RAM elements is build with these second set of transistors. An exemplary logic process may include one or more following steps:

P-type substrate starting wafer
    Shallow Trench isolation: Trench Etch, Trench Fill and CMP
    Sacrificial oxide deposition
    PMOS $V_T$ mask & implant
    NMOS $V_T$ mask & implant
    Pwell implant mask and implant through field
    Nwell implant mask and implant through field
    Dopant activation and anneal
    Sacrificial oxide etch
    Gate oxidation/Dual gate oxide option
    Gate poly (GP) deposition
    GP mask & etch
    LDN mask & implant
    LDP mask & implant
    Spacer oxide deposition & spacer etch
    N+ mask and NMOS N+ G, S, D implant
    P+ mask and PMOS P+ G, S, D implant
    Co deposition
    RTA anneal—Co salicidation (S/D/G regions & interconnect)
    Unreacted Co etch
    ILD oxide deposition & CMP FIG. 10 shows an exemplary process for fabricating a thin film MOSFET latch in a second module layer. In one embodiment the process in FIG. 10 forms the latch in a layer substantially above the substrate layer. The processing sequence in FIG. 10A through FIG. 10G describes the physical construction of a MOSFET device for storage circuits 650 shown in FIG. 6B. The process of FIG. 10 includes adding one or more following steps to the logic process after ILD oxide deposition & CMP step in the logic process.

C1 mask & etch
    W-Silicide plug fill & CMP
    ~250 A poly P1 (amorphous poly-1) deposition
    P1 mask & etch
    Blanket Vtn P– implant (NMOS Vt)
    Vtp mask & N– implant (PMOS Vt)
    TFT Gox (70 A PECVD) deposition
    400 A P2 (amorphous poly-2) deposition
    P2 mask & etch
    Blanket LDN NMOS N– tip implant
    LDP mask and PMOS P– tip implant
    Spacer LTO deposition
    Spacer LTO etch to form spacers & expose P1
    Blanket N+ implant (NMOS G/S/D & interconnect)
    P+ mask & implant (PMOS G/S/D & interconnect)
    Ni deposition
    RTA salicidation and poly re-crystallization (G/S/D regions & interconnect)
    Dopant activation anneal
    Excess Ni etch
    ILD oxide deposition & CMP
    C2 mask & etch
    W plug formation & CMP
    M1 deposition and back end metallization The TFT process technology consists of creating NMOS & PMOS poly-Silicon transistors. In the embodiment in FIG. 10, the module insertion is after the substrate device gate-poly etch and ILD film deposition. In other embodiments the insertion point may be after M1 and ILD deposition, prior to V1 mask, or between two metal definition steps.

After gate poly of regular transistors are patterned and etched, the poly is salicided using Cobalt & RTA sequences. Then the ILD is deposited, and polished by CMP techniques to a desired thickness. In the shown embodiment, the contact mask is split into two levels. The first C1 mask contains all contacts that connect TFT latch outputs to substrate transistor pass-gates. This C1 mask is used to open and etch contacts in the ILD film. Ti/TiN glue layer followed by W-Six plugs, W plugs or Si plugs may be used to fill the plugs, then CMP polished to leave the fill material only in the contact holes. The choice of fill material is based on the thermal requirements of the TFT module. In another embodiment, Ni is introduced into C1 to facilitate crystallization of the poly Silicon deposited over the contacts. This Ni may be introduced as a thin layer after the Ti/TiN glue layer is deposited, or after W is deposited just to fill the center of the contact hole.

Figure 10A:
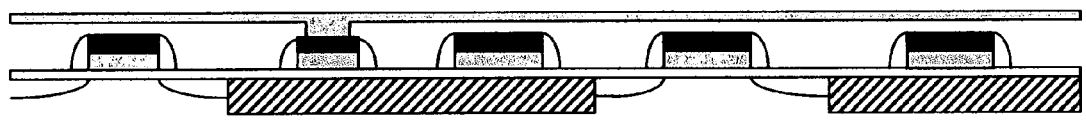
FIG. 10A-10G show process cross-sections of TFT addition to a logic process.
Figure 10B:
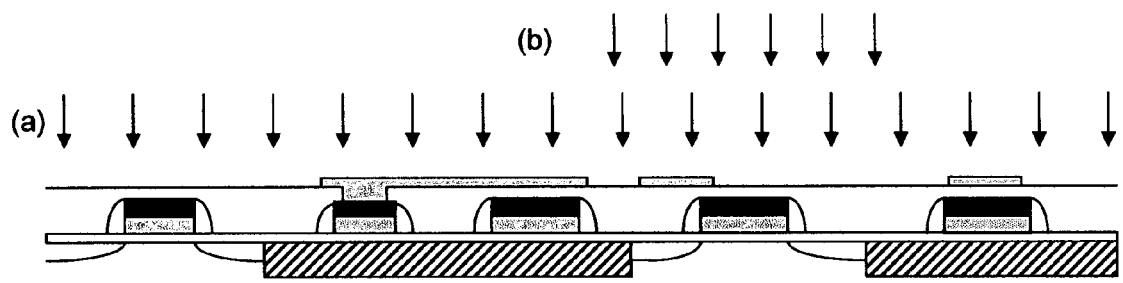

Then, a desired thickness of first P1 poly, amorphous or crystalline, is deposited by LPCVD as shown in FIG. 10A. The P1 thickness is between 50 A and 1000 A, and preferably 250 A. This poly layer P1 is used for the channel, source, and drain regions for both NMOS and PMOS TFT's. It is patterned and etched to form the transistor body regions. In other embodiments, P1 is used for contact pedestals. NMOS transistors are blanket implanted with P– doping, while the PMOS transistor regions are mask selected and implanted with N– doping. This is shown in FIG. 10B. The implant doses and P1 thickness are optimized to get the required threshold voltages for PMOS & NMOS devices under fully depleted transistor operation, and maximize on/off device current ratio. The pedestals implant type is irrelevant at this point. In another embodiment, the $V_T$ implantation is done with a mask P– implant followed by masked N– implant. First doping can also be done in-situ during poly deposition or by blanket implant after poly is deposited.

Patterned and implanted P1 may be subjected to dopant activation and crystallization. In one embodiment, an RTA cycle with Ni as seed in C1 is used to activate & crystallize the poly before or after it is patterned to near single crystal form. In a second embodiment, the gate dielectric is deposited, and buried contact mask is used to etch areas where P1 contacts P2 layer. Then, Ni is deposited and salicided with RTA cycle. All of the P1 in contact with Ni is salicided, while the rest poly is crystallized to near single crystal form. Then the un-reacted Ni is etched away. In a third embodiment, amorphous poly is crystallized prior to P1 patterning with an oxide cap, metal seed mask, Ni deposition and MILC (Metal-Induced-Lateral-Crystallization).

Then the TFT gate dielectric layer is deposited followed by P2 layer deposition. The dielectric is deposited by PECVD techniques to a desired thickness in the 30-200 A range, desirably 70 A thick. The gate may be grown thermally by using RTA. This gate material could be an oxide, nitride, oxynitride, ONO structure, or any other dielectric material combinations used as gate dielectric. The dielectric thickness is determined by the voltage level of the process. At this point an optional buried contact mask (BC) may be used to open selected P1 contact regions, etch the dielectric and expose P1 layer. BC could be used on P1 pedestals to form P1/P2 stacks over C1. In the P1 salicided embodiment using Ni, the dielectric deposition and buried contact etch occur before the crystallization. In the preferred embodiment, no BC is used.

Figure 10C:
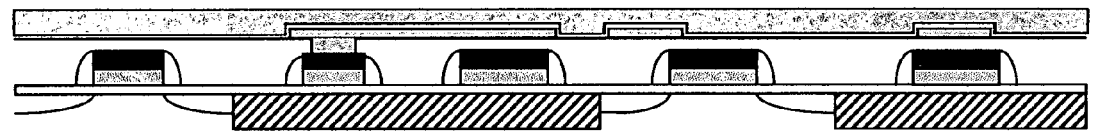
Figure 10D:
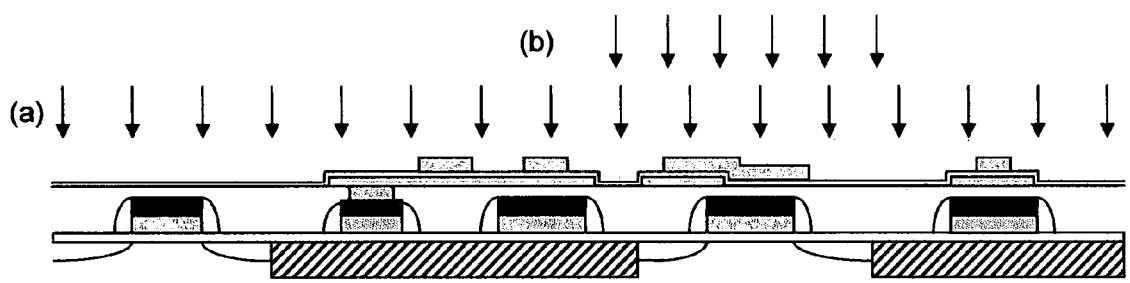

Then second poly P2 layer, 100 A to 2000 A thick, preferably 400 A is deposited as amorphous or crystalline poly-Silicon by LPCVD as shown in FIG. 10C. P2 layer is defined into NMOS & PMOS gate regions intersecting the P1 layer body regions, C1 pedestals if needed, and local interconnect lines and then etched. The P2 layer etching is continued until the dielectric oxide is exposed over P1 areas uncovered by P2 (source, drain, P1 resistors). The source & drain P1 regions orthogonal to P2 gate regions are now self aligned to P2 gate edges. The S/D P2 regions may contact P1 via buried contacts. NMOS devices are blanket implanted with LDN N− dopant. Then PMOS devices are mask selected and implanted with LDP P− dopant as shown in FIG. 10D. The implant energy ensures full dopant penetration through the residual oxide into the S/D regions adjacent to P2 layers.

Figure 10E:
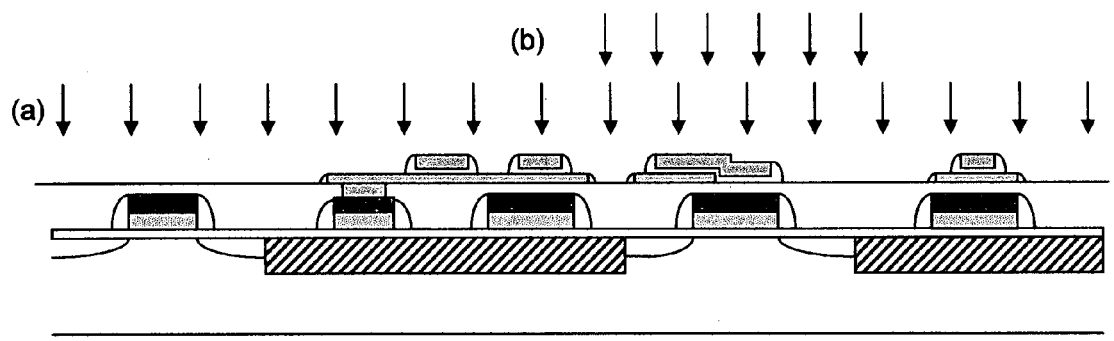

A spacer oxide is deposited over the LDD implanted P2 using LTO or PECVD techniques. The oxide is etched to form spacers. The spacer etch leaves a residual oxide over P1 in a first embodiment, and completely removes oxide over exposed P1 in a second embodiment. The latter allows for P1 salicidation at a subsequent step. Then NMOS devices & N+ poly interconnects are blanket implanted with N+. The implant energy ensures full or partial dopant penetration into the 100 A residual oxide in the S/D regions adjacent to P2 layers. This doping gets to gate, drain & source of all NMOS devices and N+ interconnects. The P+ mask is used to select PMOS devices and P+ interconnect, and implanted with P+ dopant as shown in FIG. 10E. PMOS gate, drain & source regions receive the P+ dopant. This N+/P+ implants can be done with N+ mask followed by P+ mask. The $V_T$ implanted Pt regions are now completely covered by P2 layer and spacer regions, and form channel regions of NMOS & PMOS transistors.

Figure 10F:
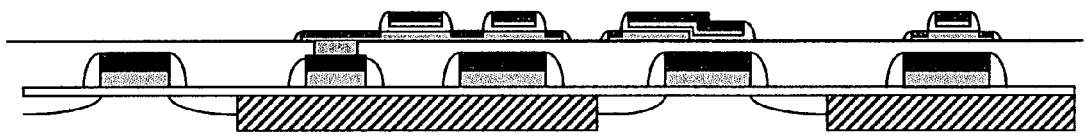

After the P+/N+ implants, Nickel is deposited over P2 and salicided to form a low resistive refractory metal on exposed poly by RTA. Un-reacted Ni is etched as shown in FIG. 10F. This 100 A-500 A thick Ni-Salicide connects the opposite doped poly-2 regions together providing low resistive poly wires for data. In one embodiment, the residual gate dielectric left after the spacer prevents P1 layer salicidation. In a second embodiment, as the residual oxide is removed over exposed P1 after spacer-etch, P1 is salicided. The thickness of Ni deposition may be used to control full or partial salicidation of P1 regions. Fully salicided S/D regions up to spacer edge facilitate high drive current due to lower source and drain resistances.

Figure 10G:
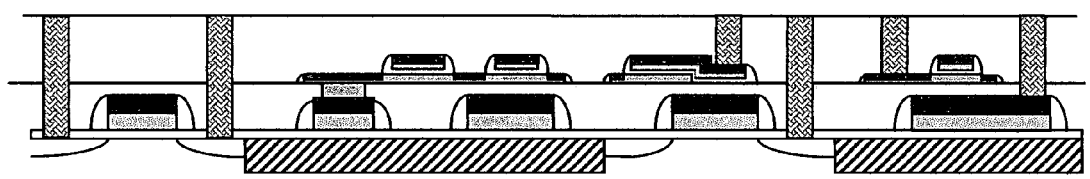

An LTO film is deposited over P2 layer, and polished flat with CMP. A second contact mask C2 is used to open contacts into the TFT P2 and P1 regions in addition to all other contacts to substrate transistors. In the shown embodiment, C1 contacts connecting latch outputs to substrate transistor gates require no C2 contacts. Contact plugs are filled with tungsten, CMP polished, and connected by metal as done in standard contact metallization of IC's as shown in FIG. 10G.

A TFT process sequence similar to that shown in. FIG. 10 can be used to build complementary Gated-FET thin film devices. Compared with CMOS devices, these are bulk conducting devices and work on the principles of JFETs. A full disclosure of these devices is provided in incorporated by reference application Ser. No. 10/413,808. The process steps facilitate the device doping differences between MOSFET and Gated-FET devices, and simultaneous formation of complementary Gated-FET TFT devices. A detailed description for this process was provided when describing FIG. 10 earlier and is not repeated. An exemplary CGated-FET process sequence may use one or more of the following steps:

C1 mask & etch
W-Silicide plug fill & CMP (optional Ni seed in W-plug)
~300 A poly P1 (amorphous poly-1) deposition
Optional poly crystallization
P1 mask & etch
Blanket Vtn N− implant (Gated-NFET $V_T$)
Vtp mask & P− implant (Gated-PFET $V_T$)
TFT Gox (70 A PECVD) deposition
500 A P2 (amorphous poly-2) deposition
Blanket P+ implant (Gated-NFET gate & interconnect)
N+ mask & implant (Gated-PFET gate & interconnect)
P2 mask & etch
Blanket LDN Gated-NFET N tip implant
LDP mask and Gated-PFET P tip implant
Spacer LTO deposition
Spacer LTO etch to form spacers & expose P1
Ni deposition
RTA salicidation and poly re-crystallization (exposed P1 and P2)
Fully salicidation of exposed P1 S/D regions
Dopant activation anneal
Excess Ni etch
ILD oxide deposition & CMP
C2 mask & etch
W plug formation & CMP
M1 deposition and back end metallization As the discussions demonstrate, memory controlled pass transistor logic elements provide a powerful tool to make switches. The ensuing high cost of memory can be drastically reduced by the 3-dimensional integration of configuration elements and the replaceable modularity concept for said memory. These advances allow designing a LUT based macrocell with more programmable bits to overcome the deficiencies associated with logic fitting in large LUT sizes. In one aspect, a cheaper memory element allows use of more memory for programmability. That enhances the ability to build large logic blocks utilizing multiple LUTs (i.e. course-grain advantage) while maintaining smaller logic element type logic fitting (i.e. fine-grain advantage). Furthermore larger grains need less connectivity: neighboring cells and far-away cells. That further simplifies the interconnect structure. Larger grains benefit by larger LUT sizes, or a larger number of bigger LUTs in a logic block. In a second aspect cheaper memory allows LUT partitioning that can efficiently utilize Silicon by fitting large and small logic pieces into a single large LUT. Such LUTs can improve Silicon utilization compared to FIG. 4. A new programmable LUT macrocell circuit utilizing the manufacturing methods shown so far is discussed next. Larger LUT integration is discussed by Wittig et al. U.S. Pat. No. 6,208,163, Agrawal et al. US 2002/0186044, Sueyoshi et al. US 2003/0001615 and Pugh et al. US 2003/0085733. They do not show the need, a method and the value in using programmable bits to provide multiple smaller LUT partitioning inside a single larger LUT for FPGA designs.

Figure 11A:
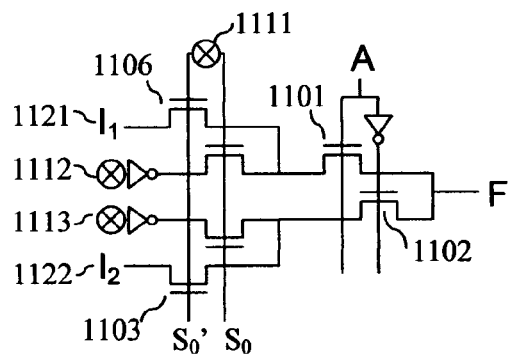
FIG. 11A shows a novel programmable 1-input LUT (1LUT).

A one input LUT (1LUT) according to current teaching is shown in FIG. 11A. The LUT is comprised of input A driving pass-gate 1101. Input compliment A' drives pass-gate 1102. Cross-circled elements 1111, 1112 & 1113 represent memory bits in a configurable memory circuit. An SRAM based memory circuit described earlier is shown in FIG. 6. Such a memory circuit provides complimentary outputs $S_0$ & $S_0'$ to control on-off behavior of pass-gates 1101-1106. The LUT values are selected by programmable bit such as 1111 in one of two configurations. When the memory bit is programmed to a logic one, the bit 1111 outputs a logic one $S_0$ on the right hand side branch and logic zero $S_0'$ on the left hand branch. When the memory bit is programmed to a logic zero, the bit 1111 outputs a logic zero $S_0$ on the right hand side branch and logic one $S_0'$ on the left hand branch. This allows selecting $I_1$, $I_2$ as LUT values by setting memory bit 1111 to zero, or selecting values stored in register 1112, 1113 pair as LUT values by setting memory bit 1111 to one. The inputs $I_1$ and $I_2$ are also driven by buffers that are not shown in FIG. 11A. Memory bits 1111, 1112 & 1113 are constructed in a thin-film module and are vertically integrated. TFT SRAM 1112 and 1113 drive inverters constructed in substrate Silicon or pass-gates coupling Vcc & Vss to provide necessary LUT value drive currents. All TFT memory circuits allow the user to change stored data as desired. The configuration circuits including memory is constructed over the pass-gate logic circuits and consumes no Silicon area and cost. When selected, the registers 1112 & 1113 can be independently set to logic states one or zero by the user, and becomes identical to the 1LUT shown in FIG. 3A. Once the desired memory pattern is identified by the user, TFT elements 1111, 1112 & 1113 can be replaced by hard-wires connected to Vcc or Vss to achieve identical logic functionality. As the timing path is restricted to signal propagation in wires and pass-gates, there is no change in timing with this conversion. As the fabrication process is simplified by eliminating TFT memory processing, the end product is cheaper to fabricate and more reliable for the user.

Figure 11B:
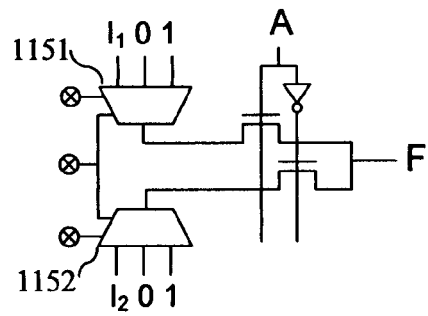
FIG. 11B shows the 1LUT in FIG. 11A with a programmable MUX to select LUT values.
Figure 11C:
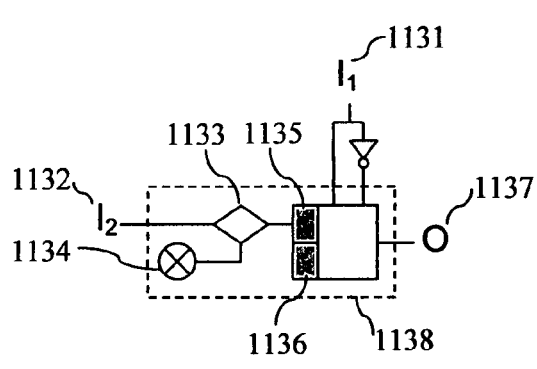
FIG. 11C shows the 1LUT block diagram in FIG. 11A with a configurable LUT value.
Figure 11D:
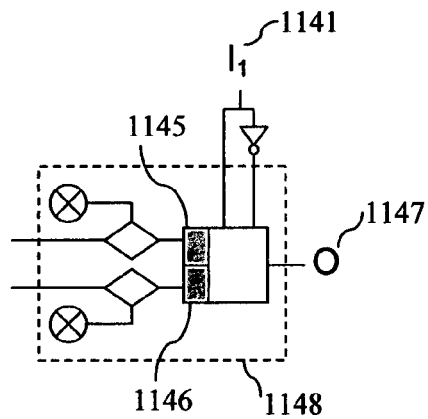
FIG. 11D shows the 1LUT block diagram in FIG. 11A with two configurable LUT values.

Two Embodiments of block diagrams of the LUT shown in FIG. 11A are shown in FIG. 11C and FIG. 11D. Referring to FIG. 11C, a programmable look up table (LUT) circuit 1138 for an integrated circuit, comprises: one or more secondary inputs 1132; and one or more configurable logic states 1134; and two or more LUT values 1135, 1136; and a programmable means 1133 to select a LUT value from a secondary input 1132 or a configurable logic state 1134. Referring to FIG. 11D, the circuit 1148 further comprises: a LUT output 1147; and M primary inputs such as 1141, where M is an integer value greater than or equal to one, each said M inputs received in true and compliment logic levels; and $2^M$ LUT values such as 1145 & 1146, each said LUT values comprising a configurable logic state or a secondary input, wherein any given combination of said M primary input signal levels couples one of said LUT values to said LUT output.

An equivalent MUX representation for FIG. 11A is shown in FIG. 11B. The LUT values are chosen from two 3-input MUXs 1151 and 1152 with 3 programmable bits, wherein the gate construction is as in FIG. 11A, and the block diagram is as in FIG. 11D.

Figure 12A:
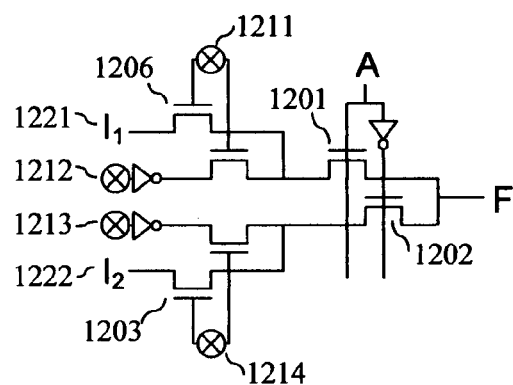
FIG. 12A & 12B show a second & third embodiment of a novel programmable 1LUT.
Figure 12B:
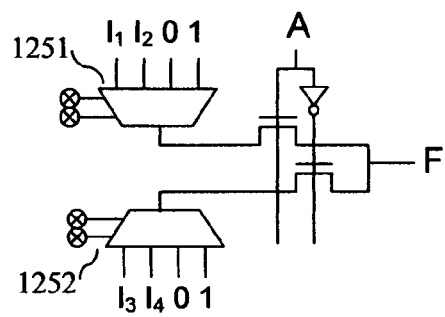

A second embodiment of a programmable 1LUT according to this teaching is shown in FIG. 12A. This 1LUT utilizes 4-programmable memory bits 1211, 1212, 1213 and 1214, and otherwise identical to 1LUT in FIG. 11A. Having 4 programmable bits allows the user to select the upper half of 1LUT independent of the lower half. For example, bit 1211 can be configured to select $I_1$ as a LUT value for A input, and bit 1214 can be configured to select register 1213 as the LUT value for A' input. This flexibility in a LUT macrocell is extremely useful to reduce Silicon wastage as will be shown later. Another embodiment of the programmable macro-cell according to these teachings utilizing 4-programmable bits is shown in FIG. 12B. This has two 4:1 MUXs 1351 and 1352 that are configured by 2 bits each for each LUT value. Each 4:1 MUX is identical to the MUX shown in FIG. 2C. LUT value for input A is programmed from $I_1$, $I_2$, 0 & 1, while LUT value for input A' is programmed from $I_3$, $I_4$, 0 & 1. This 1LUT macro-cell allows the user to select which inputs needs to couple from previous to next LUT stage. When $I_1=I_3=B$ and $I_2=I_4=B'$, FIG. 12B becomes a 2-input LUT. Memory circuits for FIG. 12 are also constructed in TFT layers to occupy no extra Silicon area.

A third embodiment of a programmable I LUT according to this teaching is shown in FIG. 13A. This 1LUT also utilizes 4-programmable memory bits 1311, 1312, 1313 and 1314, but provides an option for inputs $I_1$ and $I_2$ to by-pass the 1LUT. Otherwise, FIG. 13A is identical to 1LUT in FIG. 12A. Bit 1311 polarity controls both logic state 1312 selection and input $I_1$ by-pass. When LUT values are chosen to be logic states from 1312 & 1313, the inputs 1321 & 1322 are by-passed to registers not shown in the FIG. 13A. The circuit shown in FIG. 13A has a programmable method 1311 further comprising a means of providing said secondary input 1321 as an output when said configurable logic state 1312 is selected as a LUT value. Secondary input 1312 is provided as an output via the by-pass pass-gate 1308. Having 4 programmable bits allows the user to select the upper half of 1 LUT independent of the lower half. For example, bit 1311 can be configured to select $I_1$ as a LUT value for A input and disable $I_1$ by-pass pass-gate 1308. Bit 1314 can be configured to select register 1313 output as the LUT value for A' input and shunt 12 input to an output register through pass-gate 1303. This flexibility in a LUT macrocell is also useful to reduce Silicon wastage as will be shown later. Yet another embodiment of the programmable macro-cell according to these teachings utilizing 6-programmable bits is shown in FIG. 13B. This has two 8:1 MUXs 1351 and 1352 that are configured by 3 bits each. Each 8:1 MUX is a conventional MUX similar to the 4:1 MUX shown in FIG. 2C. Upper half of 1LUT and lower half of 1LUT are independently programmed to one of eight choices for that LUT value. Apart from 0 and 1, the remaining 6 LUT value choices need not be identical. This LUT macro-cell allows the user to select multiple inputs in a LUT structure to perform a logic function of two variables. Memory circuits for FIG. 13 are constructed in TFT layers.

A 2-input LUT construction from programmable 1LUTs is shown in FIG. 14. The 2LUT has 4LUT values in registers 1421, 1422, 1423 and 1424. These LUT values are controlled by common input B on pass-gates 1401, 1402, 1403 and 1404. The outputs from this first stage are fed to a programmable 1LUT similar to the one discussed in FIG. 13A. Four programmable registers 1425, 1426, 1427 and 1428 control the second stage 1LUT providing the capability of combining the 2 LUTs or using them independently.

Figure 15:
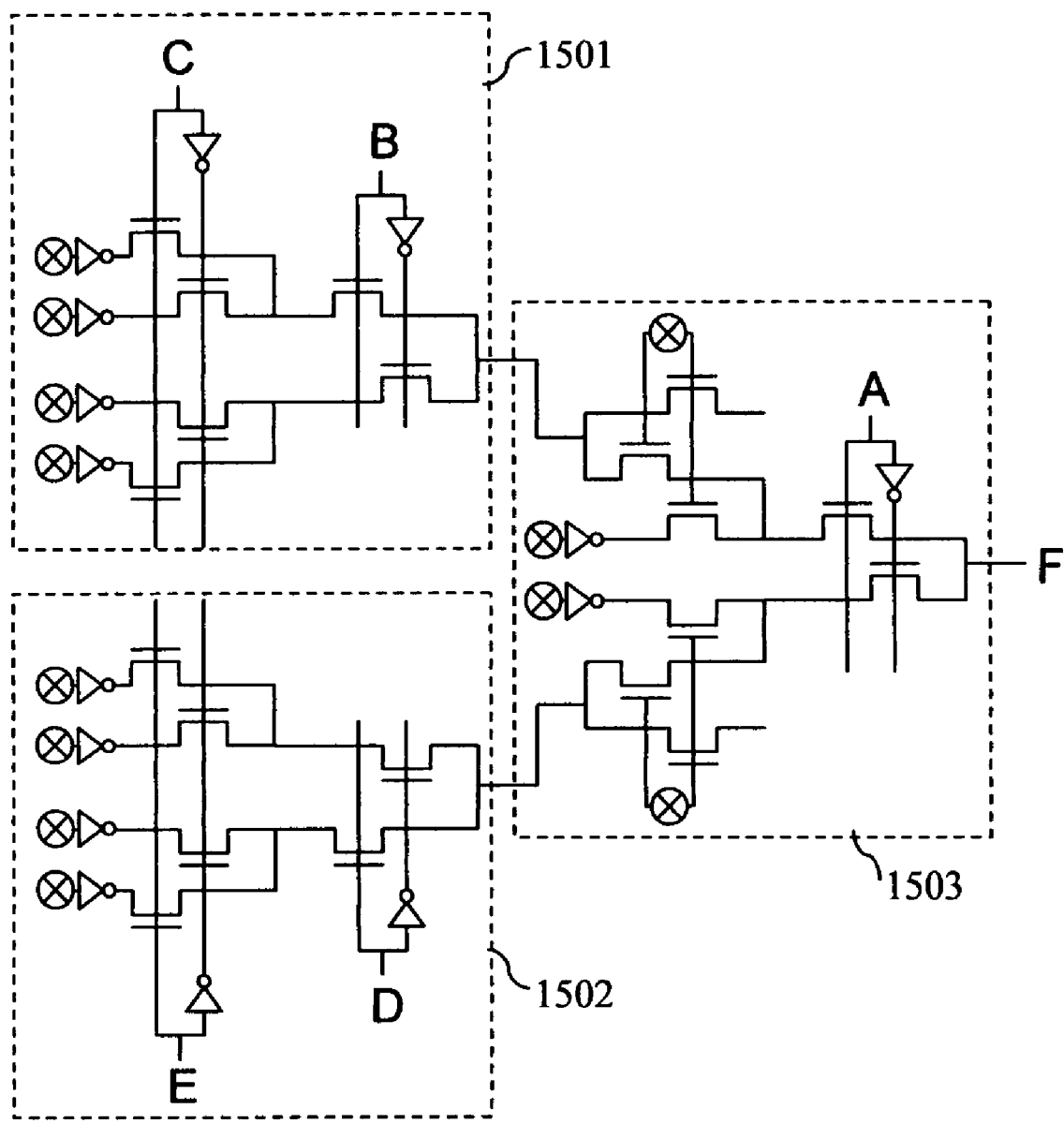
FIG. 15 shows a novel programmable 3LUT macro-cell.

A 3-input LUT (3LUT) according to present invention is shown in FIG. 15. Two conventional 2LUTs 1501 and 1502 are fed to a programmable 1LUT discussed in FIG. 13A. This LUT macrocell can be configured to perform two independent 2LUT functions and one 1LUT function. The 2LUT outputs can by-pass the 1LUT and feed registers not shown in FIG. 15. LUT macrocell can also perform one 3LUT function when C & E are made common and B & D are made common. In addition, the LUT macrocell can also perform a 3LUT (when the 3LUT function has half of the truth table entries as zero or one) plus a 2LUT. It can also perform some 4-input and 5-input variable functions. These divisions in logic allow improved logic fitting into LUT macrocells.

Figure 16A:
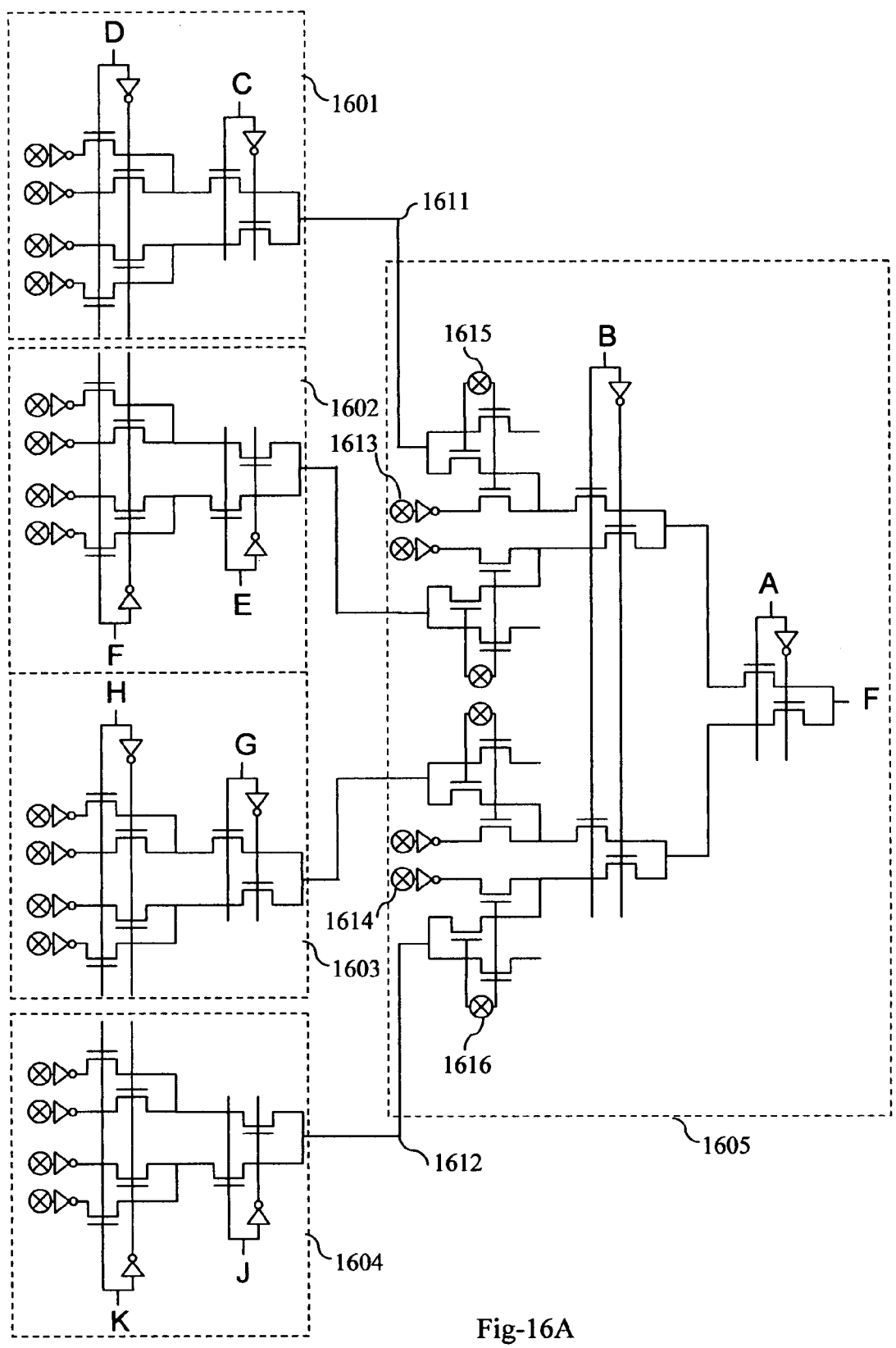
FIG. 16A shows a first embodiment of a novel programmable 4LUT macro-cell.
Figure 16B:
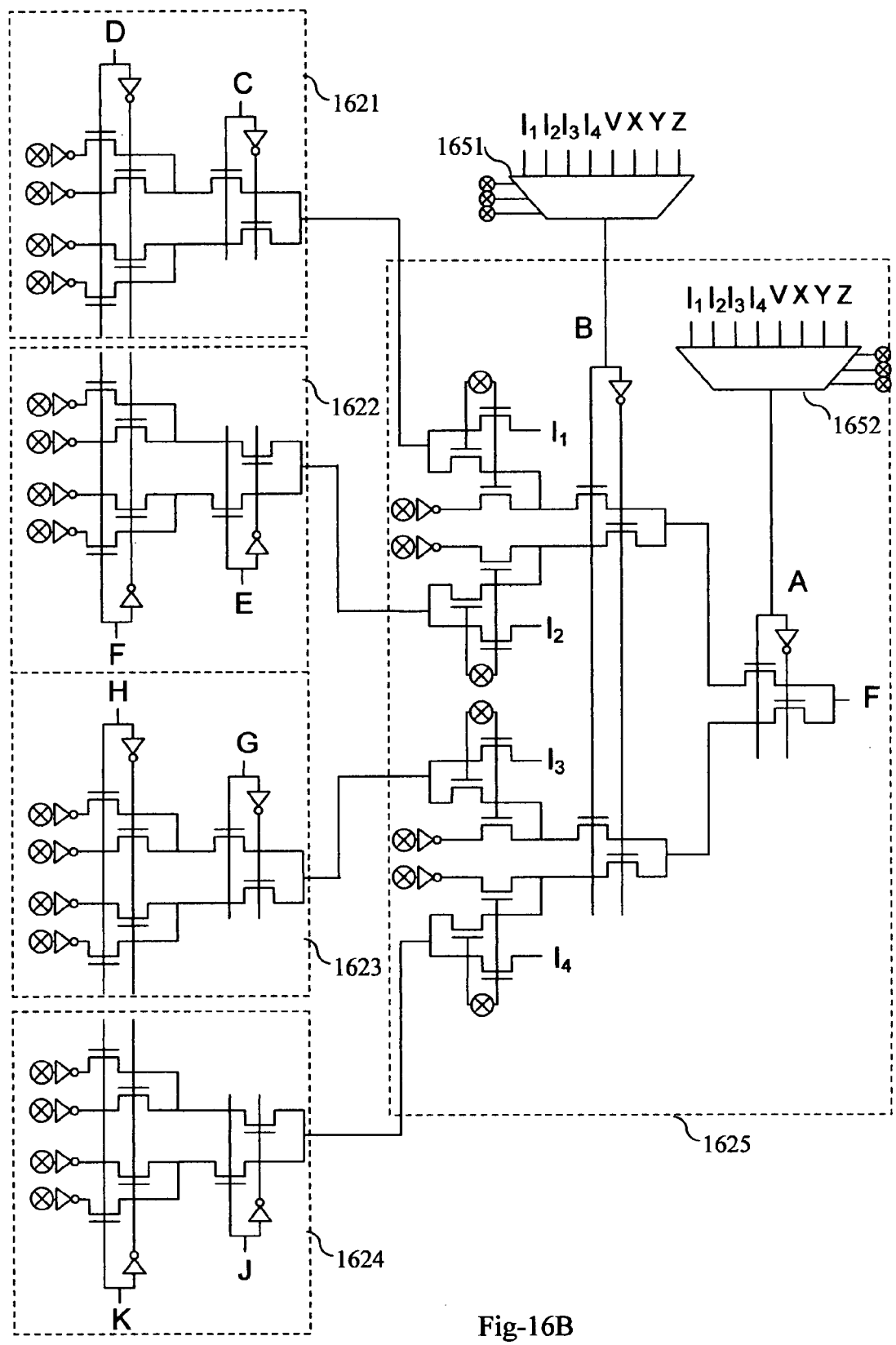
FIG. 16B shows a second embodiment of a novel programmable 4LUT macro-cell.

A 4-input LUT (4LUT) according to present invention is shown in FIG. 16A and FIG. 16B. In FIG. 16A, four conventional 2LUTs 1601-1604 are fed to a programmable 2LUT 1605. The 2LUT 1605 is constructed with 2 programmable 1LUTs discussed in FIG. 13A. This LUT macrocell can be configured to perform a wide variety of logic functions. It can perform five independent 2LUT functions, and all 2LUT outputs can be fed to registers (not shown). This is done by programming 2LUT 1605 to full independent mode by selecting all configurable states (such as 1613 & 1614) as LUT values. It can also perform one 4LUT function when first stage inputs (D, F, H, K) are made common and second stage inputs (C, E, G, J) are made common. There may be programmable switches to make these common inputs. When the 4LUT function has rows or columns in the truth table entries as zero or one, a LUT value is chosen in 2LUT 1605 to save a full 2LUT in a prior stage. Hence the LUT macrocell can also performs a 4LUT plus one or more 2LUTs to enhance logic density. It can also perform some 5-input, 6-input, up to 10-input variable functions. The LUT inputs are selected from a group of external inputs by programmable MUXs not shown in the diagram. These divisions in logic allow improved logic fitting into LUT macrocell based architectures. Compared to percentage logic overhead for 1LUT 1503 in FIG. 15, the percentage overhead required for the added flexibility in 2LUT 1605 is lower in FIG. 16A.

Referring to FIG. 16A, A programmable look up table circuit 1605 for an integrated circuit, comprises: M primary inputs (such as A & B), wherein M is an integer value greater than or equal to one, and each said M inputs received in true and compliment logic levels; and $2^M$ secondary inputs (such as 1611, 1612); and $2^M$ configurable logic states (such as 1613, 1614), each said state comprising a logic zero and a logic one; and $2^M$ LUT values; and a programmable means to select each of said LUT values from a secondary input (such as 1611) or a configurable logic state (such as 1613). In circuit 1605, each of said secondary inputs (such as 1611) is further comprised of an output of a previous K-LUT circuit (such as 1601), said K-LUT circuit comprising: a LUT output (same as 1611); and K inputs (such as C & D), wherein K is an integer value greater than or equal to one, and each said K inputs received in true and compliment logic levels; and $2^K$ LUT values (such as crossed-circle latch outputs in 1601), each said LUT values comprising two configurable logic states.

Referring to FIG. 16A, a larger N-LUT is constructed with smaller K-LUTs (such as 1601-1605). Each smaller K-LUT is further constructed as one of: 1LUT, 2LUT, 3LUT up to (N−1)-LUT smaller LUTs. In FIG. 16A, K is equal to 2. The N-LUT is constructed as a K-LUT tree, staged with K-LUTs, where $2^K$ outputs from a first stage feed as LUT values to each of next stage. Each K-LUT has $2^K$ LUT values and K inputs. There is a $2^K$ reduction in the number of K-LUTs from one stage to the next. The last K-LUT has only one output. Each K-LUT (such as 1601) in turn is comprised of one or more 1LUTs arranged in one or more stages. The K-LUT is also constructed as a 1LUT tree, staged with 1LUTs, where two outputs of a first stage feed as LUT values to next stage. A secondary K-LUT stage (such as 1605) provides programmability in connecting K-LUTs (from 1601-1604) to form an N-LUT tree. K-LUTs 1601-1604 outputs can by-pass K-LUT 1605 to registers. By programming the by-pass option, all K-LUTs can be used independently. A first stage in a secondary K-LUT 1605 comprises 1LUTs having two LUT values that can be configured to be one of two options: programmable logic states (such as 1613 output), or two previous LUT outputs (such as 1611). Except the first stage, every subsequent secondary LUT stages in the N-LUT may have K-LUTs comprising a first stage with this programmable capability. When LUT values are configured as logic states, the N-LUT may compute $(2^N-1)/(2^K-1)$ independent smaller K-LUT functions. When all secondary LUT values are configured as outputs from previous LUTs, and the K-inputs in each stage is made common to all K-LUTs in that stage, the K-LUT may be used to construct one N-LUT logic function. When all the K-LUT inputs are not made common to all the K-LUTs in that stage, a logic function with more than N-inputs may fit into an N-LUT tree. This hierarchical K-LUTs arrangement is called a LUT macrocell circuit. The LUT macrocell provide programmability to combine multiple smaller LUTs to one larger LUT, or implement logic in smaller LUT form.

The circuit in FIG. 16B is only different to that in FIG. 16A on the method of choosing inputs to programmable 2LUT 1625. Both A and B inputs have the capability of being selected from external inputs V, X, Y & Z, or prior LUT outputs $I_1, I_2, I_3$ & $I_4$. The programmable look up table (LUT) macro-cell circuit for an integrated circuit in FIG. 16B, comprises: a plurality of LUT devices 1621-1625; each said LUT device having an output (such as $I_1$-$I_4$, F), at least one input (such as A-K), and at least two LUT values; and a programmable means (such as MUX 1651) of selecting inputs to at least one of said LUT devices from one or more other LUT device outputs and external inputs; and a programmable means of selecting LUT values to at least one of said LUT device (such as 1625) from one or more other LUT device outputs and configurable logic states. The crossed-circles show memory bits that need programming to customize the LUT functions. The Silicon consumption for SRAM cells is reduced as demonstrated by the incorporated references.

A programmable macro look up table (macro-LUT) circuit in FIG. 16B for an integrated circuit, comprises: a plurality of LUT circuits (1621-1625), each of said LUT circuits comprising a LUT output, at least one LUT input, and at least two LUT values; and a programmable means (such as 1651) of selecting LUT inputs to at least one of said LUT circuits from one or more other LUT circuit outputs and external inputs, and selecting LUT values to at least one of said LUT circuits (such as 1625) from one or more other LUT circuit outputs and configurable logic states, said programmable means further comprised of two selectable manufacturing configurations, wherein: in a first selectable configuration, a random access memory circuit (RAM) is formed, said memory circuit further comprising configurable thin-film memory elements; in a second selectable configuration, a hard-wire read only memory circuit (ROM) is formed in lieu of said RAM, said ROM duplicating one RAM pattern in the first selectable option.

Figure 17A:
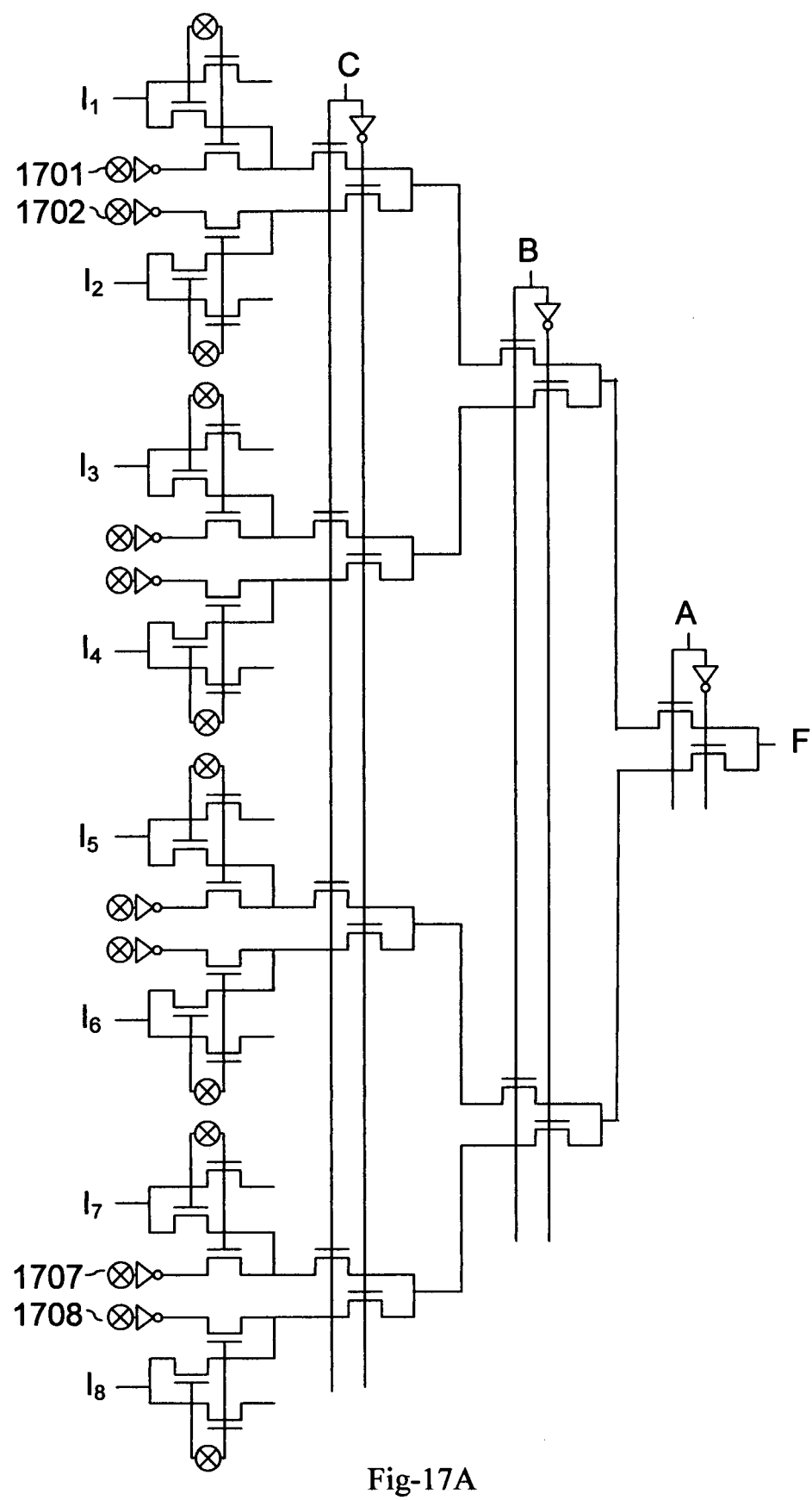
FIG. 17A shows a first embodiment of a novel programmable 3LUT.
Figure 17B:
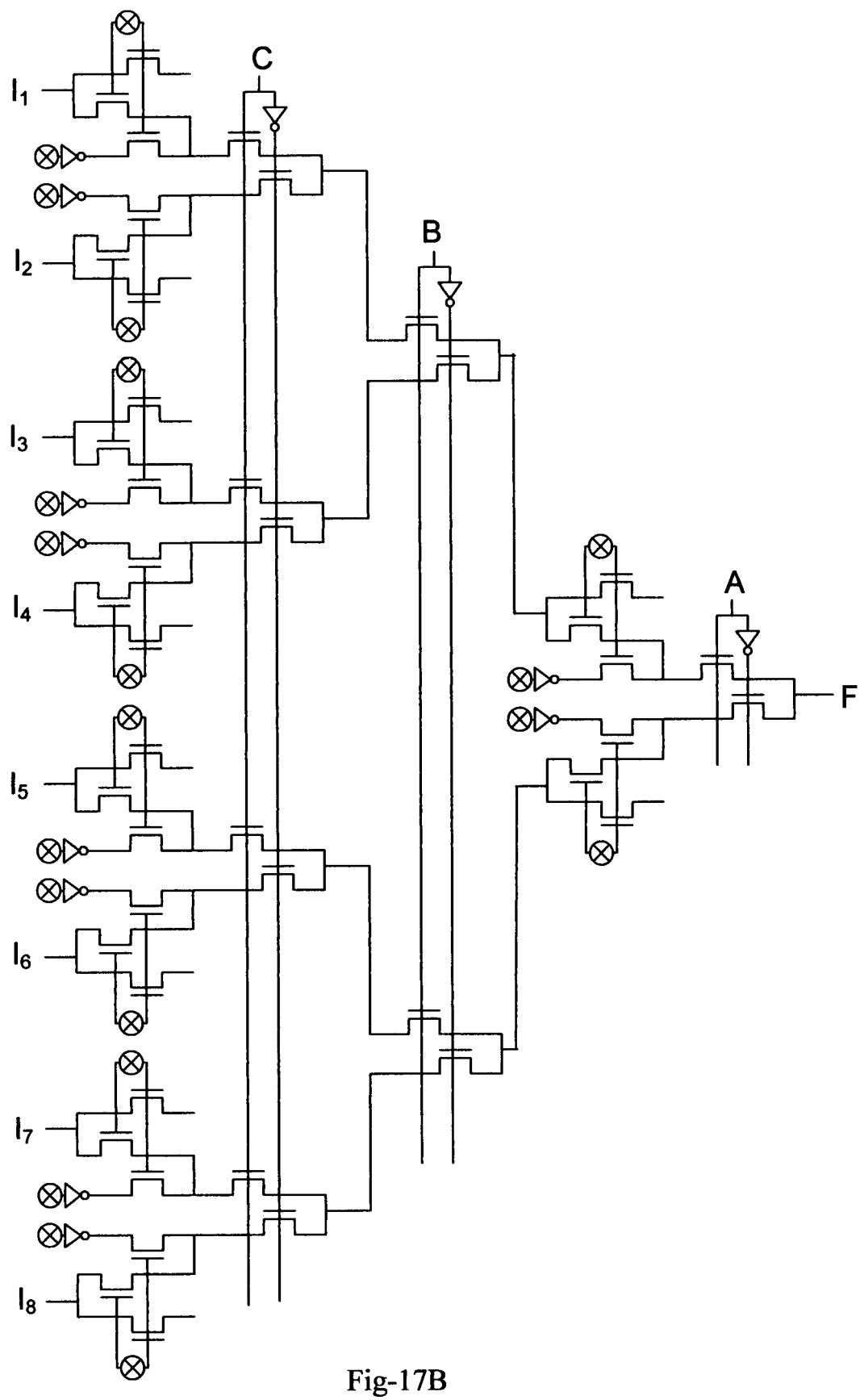
FIG. 17B shows a second embodiment of a novel programmable 3LUT.

A 5-input LUT (5LUT) can be easily constructed with the method presented in FIG. 16. The four circuits 1601-1604 can be replaced by four conventional 3LUTs. The four outputs can be fed as shown in FIG. 16 into the programmable 2LUT. Similarly a 6LUT macrocell can be constructed by constructing four conventional 4LUTs in the first stage in FIG. 16. The outputs from 4LUTs are then fed to the programmable 2LUT as shown in FIG. 16. Two programmable 3LUT versions are shown in FIG. 17A and FIG. 17B. In FIG. 17A, six 1LUTs as discussed in FIG.-13A are combined as shown. In FIG. 17B, seven 1LUTs as discussed in FIG. 13A are combined in two stages as shown. A 6LUT macrocell can be constructed by combining six conventional 3LUTs with either of the two programmable 3LUTs shown in FIG. 17A and FIG. 17B. A programmable look up table (LUT) circuit in FIG. 17A for an integrated circuit, comprises: N primary inputs (such as A, B, C), wherein N is an integer value greater than or equal to one, and each said N inputs received in true and compliment logic levels; and $2^N$ secondary inputs (such as $I_1$-$I_8$); and $2^N$ LUT values, each said LUT values comprising a programmable method to select between one of said secondary inputs (such as $I_1$-$I_8$) or a configurable logic state (such as one of 1701-1708).

Figure 18D:
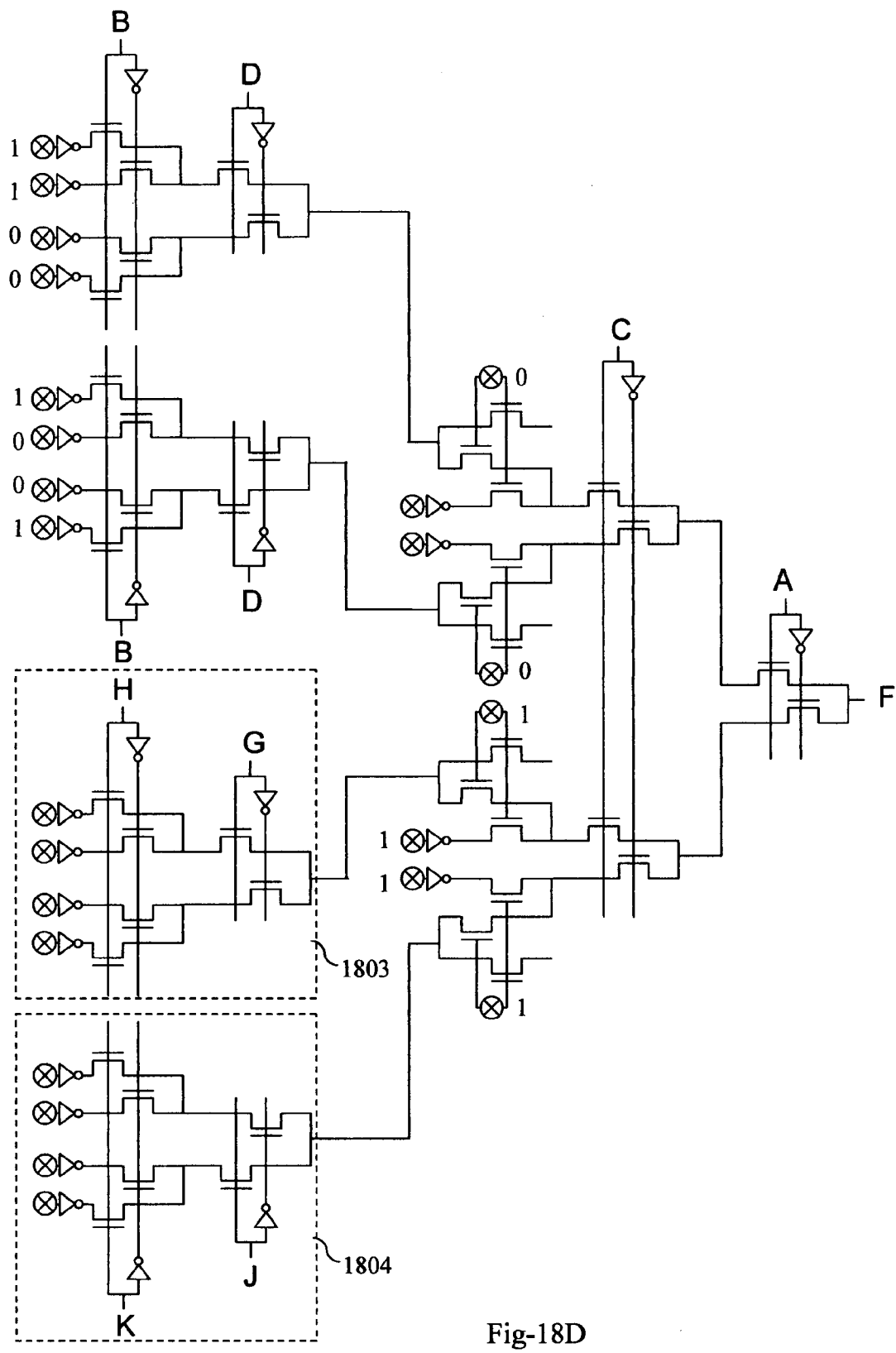
FIG. 18D shows a programmable 4LUT gate realization of logic function in FIG. 18B.

The efficiency of these LUT macrocells in Silicon utilization can be demonstrated with the 4-variable truth table and the logic function shown in FIG. 18A. It realizes a function that lends to truth table logic reduction. A 1LUT gate realization of the function is shown in FIG. 18B. It uses only four 1LUTs. The same function is ported to a 4LUT shown in FIG. 18C. There are 15 equivalent 1LUTs in the 4LUT, and all are required to implement the function. The 4LUT is seen to occupy 3.75× more pass-gate Silicon in this example compared to an ideal implementation shown in FIG. 18B (without counting the programmable memory bits required to set the LUT values). If we use the 4LUT macro-cell shown in FIG. 16 which provides 2LUT divisibility, this function can be implemented as shown in FIG. 18D. The bit polarity required to achieve the desired functionality are shown next to each bit in FIG. 18D. That allows two 2LUTs 1803 and 1804 to be used for other 2-input logic functions. Those outputs can be taken out to registers via the by-pass circuitry. The macrocell shown in FIG. 16 can be partitioned into 2LUTs by design and used as five 2LUT blocks. It uses an equivalent of 21 1LUT gates, compared to 15 for the 4LUT in FIG. 18C. Column-4 in FIG. 4 shows that 4LUT on the average is only 36% efficient compared to 2LUTs at fitting logic. Accounting for 21/15 inefficiency for the larger Si foot-print in the 4LUT macrocell in FIG. 16, it is still ~2× more efficient at fitting an average logic design in 2LUT pieces.

Figure 2E:
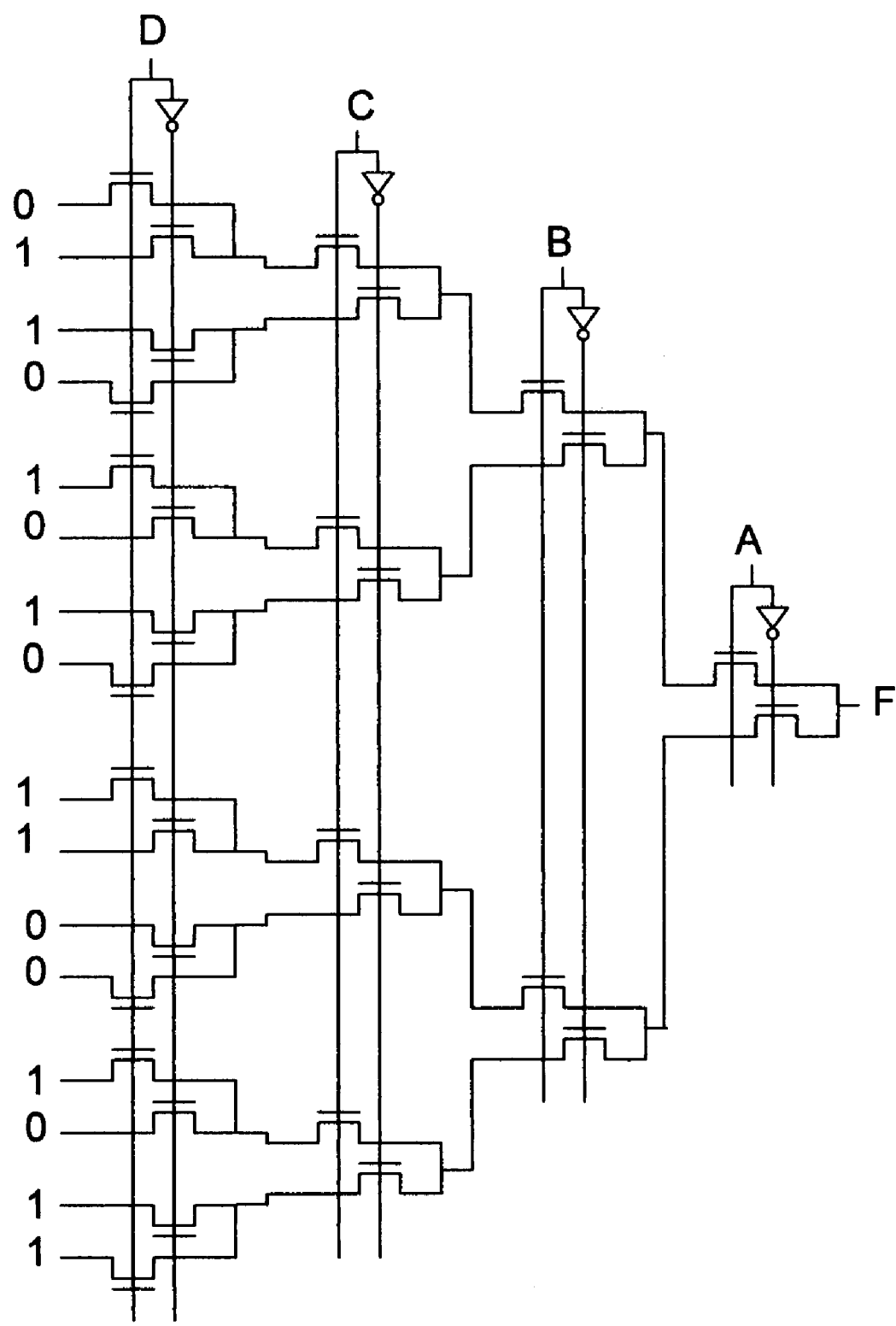
FIG. 2E shows a 4-input LUT realization of the function shown in FIG. 2A.
Figures 19, 20A, 20B:
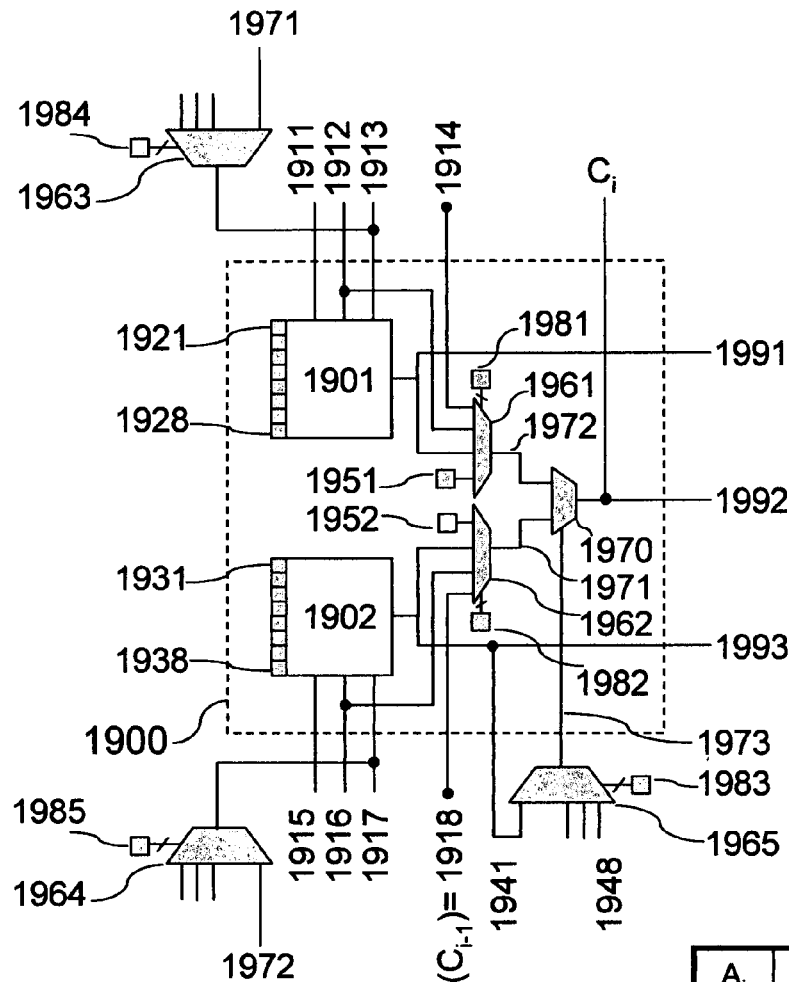
FIG. 19 shows a programmable 4LUT adapted for carry logic implementation.
FIG. 20A & 20B show an adder functional equations & truth table respectively

An additional advantage of the novel LUT structure described is an adaptation of the elements into a very efficient carry logic functions. These functions include adders, subtracters, parity checkers, comparators and pattern detectors. In prior art teaching, dedicated multiplexer, XOR, NAND, OR and other logic functions are incorporated within LUT structures to facilitate carry-logic implementations. Specialized hard-ware increase Silicon area and cost. In FIG. 19, a macro 4LUT 1900 is constructed according to divisible LUT principles shown in FIGS. 11-18 that is adapted for dense & fast carry logic implementations. The 4LUT 1900 comprises two independent 3LUTs 1901 and 1902. The 3LUT 1901 receives three primary inputs 1911, 1912 and 1913 in true and complement form. Each said input (such as input 1911) may comprise a programmable means (such as programmable multiplexer 1963 comprising configuration elements 1984 to select input 1911) to select one of a plurality of available inputs. Such programmable means not shown in FIG. 19 also exist for inputs 1912 & 1913. The true & compliment levels of the selected input may be generated as shown in FIG. 2B, and is not shown in FIG. 19. The 3LUT 1901 further comprises eight LUT values 1921-1928. In one embodiment, these LUT values are programmable data values, each value at logic zero or logic one. Such data values may be generated by configurable memory elements as shown in FIG. 3A & 11A, or by hard-wired mask programmable Vcc and Vss connections, or by other methods. In a second embodiment, these LUT values may be secondary inputs, generated by logic blocks else where in the device or by external inputs to the device. A given combination of inputs 1911-1913 will couple one of the LUT values 1921-1928 to the 3LUT 1901 output 1991. 3LUT 1902 is also constructed similarly, wherein primary inputs 1915-1917 couple one of LUT values 1931-1938 to output 1993. One familiar in the art will be able to construct LUT blocks 1901 and 1902 as 2LUTs, or 4LUTs or in any other manner according to the teachings provided herein. The programmable means 1963 & 1964 to select the primary inputs to these 3LUTs are similar to programmable means 1965. The primary inputs need not be identical between the two 3LUTs. For example, in one embodiment, input 1911 and 1915 may be common. In another embodiment input 1911 may differ from input 1915. In a third embodiment input 1911 may be common with input 1917. These inputs are chosen by a software tool to optimize timing and other constraints that are optimized within the LUT structure. In one embodiment, the inputs 1911-1913 & 1915-1917 may comprise a plurality of available common inputs, from which one can be selected by a programmable means. For example inputs to multiplexers 1963 and 1964 are common. In a preferred embodiment, the inputs 1911-1913 & 1915-1917 may comprise a plurality of common inputs and a unique input from which one input can be selected by a programmable means. For example, in the two MUXs 1963 & 1964 for inputs 1911 & 1915, except for input 1971 & 1972, all remaining inputs may be common. Each of the 3LUTs 1901 and 1902 comprises three LUT stages comprising a first stage, an intermediate stage and a final stage as shown in FIG. 3D. The 4LUT 1900 comprises four stages as shown in FIG. 3E, wherein the first stage combines both first stages of the two 3LUTs 1901 & 1902. In the shown embodiment, there are two primary inputs 1911 & 1915 for the first stage of 4LUT 1900, which may be programmed to be a common input signal, or different input signals. Similarly, the second stage of 4LUT 1900 combines the two intermediate stages of 3LUTs 1901 & 1902. Again the second inputs 1912 and 1916 may be programmed to be common or different inputs. The third stage of 4LUT 1900 combines the two final stages of 3LUTs 1901 & 1902. The final stage of 4LUT 1900 comprises the 1LUT (or, equivalently 2:1 multiplexer) 1970. The fourth primary input 1973 to 4LUT 1900 is received at this last stage in true and compliment levels. The fourth stage comprises two LUT values 1972 and 1971. Each of the MUX elements may be constructed by a pass-gate, which may comprise PMOS, or NMOS or CMOS transistors. They may also comprise electo-chemical elements or floating gate elements such as pass-gates to select one LUT value from a plurality of available LUT values to couple to the LUT output. LUT value 1971 is further comprised of a programmable means 1982 to select one of a configurable data value 1952, an output from a previous LUT stage 1993, a primary input 1917 and a secondary input 1918 as the LUT value 1971. LUT value 1972 also comprises a programmable means 1981 to select one of a configurable data value 1951, an output from a previous LUT stage 1991, a primary input 1913 and a secondary input 1914 as the LUT value 1972. In the preferred embodiment, only the true polarity of primary inputs 1913 and 1917 are provided to multiplexer elements 1961 and 1962 respectively. In other embodiments, either compliment polarity or both polarities may be provided. In one embodiment the secondary inputs 1914 & 1918 are outputs of other macro 4LUT structures. In a preferred embodiment, input 1914 is the output of a $2^{nd}$ 4LUT 1900 located above, and input 1918 is the output of a $3^{rd}$ 4LUT 1900 located below. The LUT values 1971 is provided as a programmable inputs to input 1911 for 3LUTs 1901, and LUT values 1972 is provided as a programmable inputs to input 1915 for 3LUTs 1902.

In one preferred embodiment, a plurality of macro 4LUT structures 1900 are arranged in a column, said elements numbered 1900_1, 1900_2, 1900_3, . . . , 1900_N in the cluster. The secondary input 1918_1 may comprise a connection from the interconnect matrix, or from a neighboring 4LUT cluster. The output 1992_1 is coupled to input 1918_2, output 1992_2 is coupled to input 1918_3, and so forth until output 1992_N is coupled to the interconnect matrix or a next 4LUT cluster. Similarly the secondary input 1914_N may comprise a connection from the interconnect matrix, or from a neighboring 4LUT cluster. The output 1992_N is coupled to input 1914_(N−1), output 1992_(N−1) is coupled to input 1914_(N−2), so on and so forth until output 1992_1 is coupled to the interconnect matrix or a next 4LUT cluster. Such an arrangement facilitates superior (dense & fast) carry logic implementations in these 4LUT columns. Fast ripple carry logic and look ahead carry logic implementations are described next. The logical equations to implement a full adder are shown in FIG. 20A, and the truth table for the same is shown in FIG. 20B.

The first 4LUT 1900_1 initiates a carry logic function. The carry_in C0 to the first stage is either a logic zero or logic one value. More typically it is a logic zero value. Data value 1952_1 is programmed to the desired C0 value to initiate carry-in, and in MUX 1962_1, the programmable means 1982_1 is set to select data value 1952_1 as the LUT value 1971_1 for final stage 1970_1. The LUT value input 1971_1 is further selected in the MUX 1963_1 to couple to input 1913_1 for 3LUT 1901_1. Thus C0 is fed to 3LUT 1901_1 as a primary input. Primary inputs 1915_1 & 1911_1 are coupled to first bit A1, and primary inputs 1916_1 and 1912_1 are coupled to second bit B1. Primary input 1917_1 is a dont_care, and in more complex logic implementations it is coupled to an ADDSUB signal that differentiates between an adder and a subtracter. (When ADDSUB=1, an addition is performed, and when ADDSUB=0, a subtraction is performed). Input 1912_1 is further selected by MUX 1961_1 via means 1981_1 as the LUT value 1972_1 for $4^{th}$ stage 1970_1. Thus the two LUT values for 1970_1 are: 1971_1=C0 and 1972_1=B1. The output 1993_1 of 3LUT 1902_1 is coupled to input 1973_1 via MUX 1965_1 and means 1983_1. The 3LUT 1902_1 is configured to perform (A1⊕B1)=/AB+A/B) logic function by programming the eight LUT values 1931_1-1938_1 appropriately. (Notation / A means not A). Note that for 3LUT 1902_1, primary inputs are: 1915_1=A1, 1916_1=B1 and 1917_1=Don't Care (or ADDSUB). The 3LUT 1901_1 is configured to perform S1 as shown in FIG. 20B by programming the LUT values 1921_1-1928_1 appropriately. Note that for 3LUT 1901_1, primary inputs are: 1911_1=A1, 1912_1=B1 and 1917_1=C0. Therefore, S1 is generated in 3LUT 1901_1, and output 1991_1=S1=(A1⊕B1⊕C0); which can be latched to a register not shown in FIG. 19. For the MUX 1970_1, the two LUT value inputs are: 1971_1=C0 and 1972_1=B1, and input 1973_1=(A1⊕B1). Thus carry-out C1 is generated at output 1992_1, as shown by the equations in FIG. 20A.

Similarly, the second 4LUT 1900_2 will perform an analogous computation with data A2, B2 and carry-in C1. The carry C1 generated in 1900_1 is coupled to input 1918_2. The MUX 1962_2 is programmed by means 1982_2 to couple C1 to 1971_2. In the $2^{nd}$ 4LUT 1900_2, MUX 1970_2 receives B2=1972_2 & C1=1971_2 as LUT value inputs and (A2⊕B2)=1973_2 as primary input. Output 1992_2 generates carry-out=C2. 3LUT 1902_2 receives A2=1915_2 & B2=1916_2 data values to generate 1993_2=(A2⊕B2). 3LUT 1901_2 receives A2=1911_2, B2=1912_2 & C1=1913_2 signals to generate 1991_2=S2=(A2⊕B2⊕C1). This implementation to generate carry is a ripple carry feature, wherein the carry only propagates through the $4^{th}$ stage of the 4LUT. The carry propagate delay is MUX 1962 delay+MUX 1970 delay per stage. Any carry function can be initiated at any 4LUT location by simply setting the data value 1952 in the initiating 4LUT 1900 to C0=0. While this description is provided to illustrate implementing carry logic in partitionable or divisible LUT structures, one familiar in the art may construct many other implementations with the basic principles disclosed.

A subtract function can be implemented in the 4LUT 1900 in FIG. 19 as shown in FIG. 21. To initiate a subtract function, C0=1 is set in data value 1952_1. All the remaining implementation detail is exactly same as for the previously discussed Adder function, with Bi in the add function now replaced with /Bi. Simply the Bi & /Bi inputs can be swapped for the two 3LUTs 1901 and 1902, or LUT values 1931-1938 and 1921-1928 can be programmed accordingly. One familiar in the art will appreciate that 3LUT 1902 can be configured to perform A⊕B in the top half with 4LUT values and A⊕/B in the bottom half with the other 4LUT values 1931-1938. Thus ADDSUB=1 can select the top half output (add), and ADSUB=0 can select the bottom half output (subtract) of 3LUT 1902.

A parity check of an n-bit word as shown in FIG. 22 is easily implemented in FIG. 19 as follows. Bits X1, X2 & X3 are fed to 3LUT 1902_1 as inputs 1915_1, 1915_2 & 1917_1 respectively. 3LUT 1902_1 is configured to perform X1⊕X2⊕X3=1993_1. This output 1993_1 is coupled to 1971_1, which in turn is coupled to input 1913_1. Inputs 1911_1=X4 & 1912_1=X5. 3LUT 1901_1 is configured to perform (X1⊕X2⊕X3)⊕X4⊕X5=1991_1. This can be latched to a register not shown. MUX 1961_1 is set to couple 1991_1 to LUT value input 1972_1, and an input 1 (or 0) is selected for 1LUT 1970_1 input to couple 1972_1 to output 1993_1, which can be fed to next stage 1900_2 as a primary input to 3LUT 1902_2. The second 1900_2 is programmed to provide the output ((((X1⊕X2⊕X3)⊕X4⊕X5))⊕X6⊕X7))⊕X8⊕X9)=1993_2 at the output. Thus two special 4LUTs 1900 will offer nine bit parity check, while two conventional hard-wired 4LUTs will allow only seven bits within two 4LUTs.

A two n-bit word comparator shown in FIG. 23 is easily implemented in FIG. 19 as follows. In a first 1900_1 4LUT, LUT value 1952_1=1, and 1973_1=A0. 3LUT 1902_1 is free and used for other logic implementation. 3LUT 1901_1 has inputs 1911_1=B0, 1912_1=xi & 1913_1=yi. 3LUT 1901_1 is configured to compute (/xi*yi*/Bi−1). 1LUT 1970_1 computes Ai as shown in FIG. 23B. In a second 1900_2 4LUT, LUT value 1952_2=1, and 1973_2=B0. 3LUT 1902_2 is free and used for other logic implementation. 3LUT 1901_2 has inputs 1911_2=A0, 1912_2=xi & 1913_2=yi. 3LUT 1901_2 is configured to compute (xi*/yi*/Ai−1). 1LUT 1970_2 computes Bi as shown in FIG. 23B. For the comparator implementation, two additional 3LUT 1901 are free for other logic (improved logic density) compared to traditionally hard-wired 4 input LUTs in prior art.

Figure 1B:
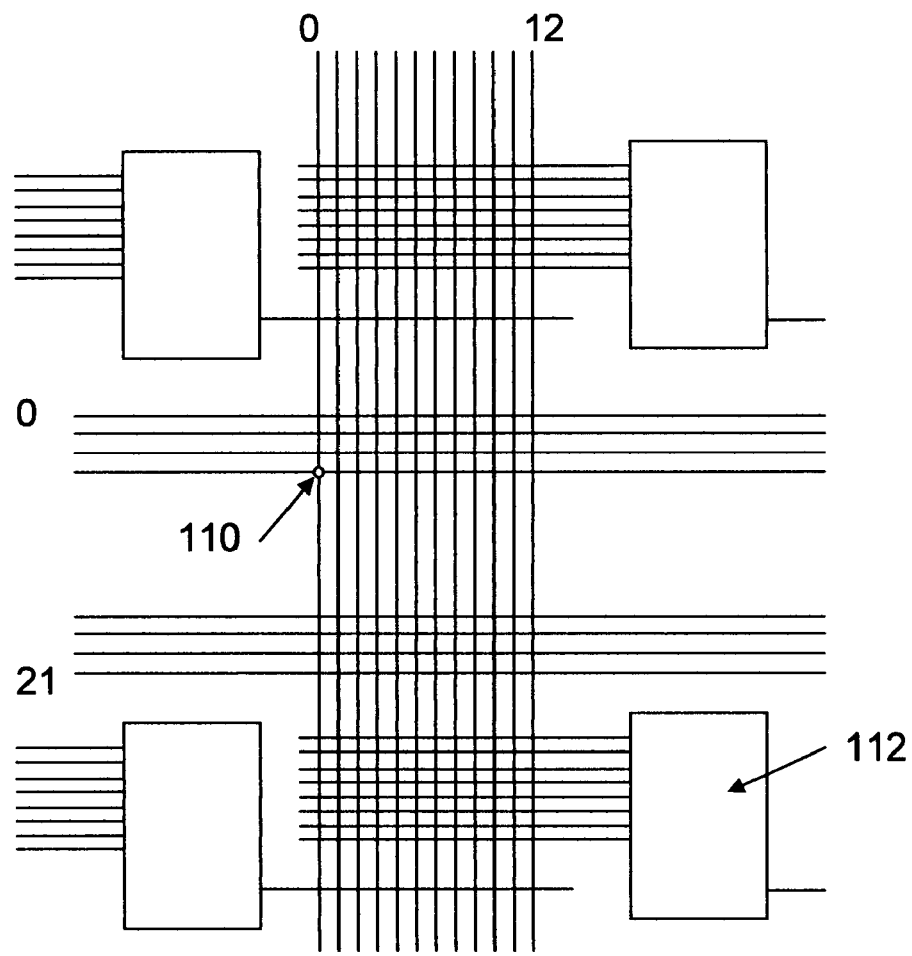
FIG. 1B shows an exemplary programmable wire structure utilizing a logic element.
Figure 25B:
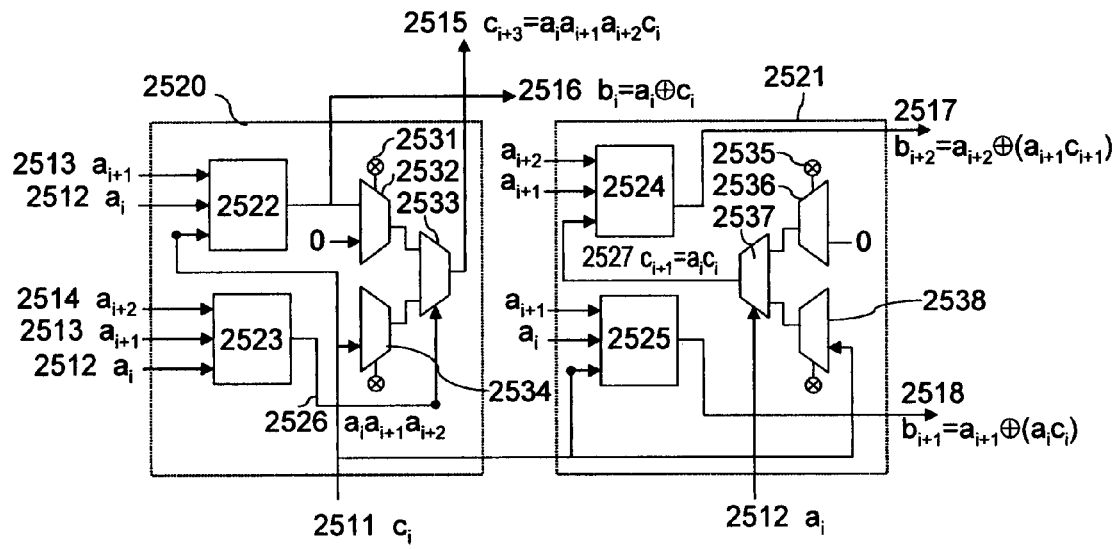

An incrementer/decrementer (referred as incrementer hence forth) implementation using carry logic in macro-LUT structures are disclosed next. An incrementer adds a data value (i.e. 1 or −1) to a word comprising a data string (examples of 8-bit data string is 01100110). The data string has a least order bit and a highest order bit. A single bit incrementer computation as computed in prior art is shown in FIG. 24A. In FIG. 24A, 2410 is a logic block comprising two inputs 2401, 2402 and two outputs 2403, 2404. Input $c_i$ is the carry-in from lower order bit to $a_i$; output $b_i$ is the incremented value of $a_i$ based on $c_i$; and $c_i+1$ is the carry-out to the next higher order bit. A typical LUT structure in an FPGA comprises only one output hence 2410 may be two LUT structures to generate two outputs. Theoretically two 2-input LUT structures would suffice to implement FIG. 24A. A typical LUT structure in an FPGA further comprises 4LUT structures, hence two 4LUT structures are needed to compute the two 2-input functions in FIG. 24A—only a 20% Si utilization compared to more efficient 2LUT implementation. This is a significant wastage of Si resources. Furthermore, generating $c_{i+1}$ via a typical 4LUT structure is too slow as $c_i$ signal must couple to wide fan-in LUT inputs which are slow. As shown in referenced prior art, most FPGA providers insert extra gates adjacent to LUT structures to compute a fast carry. Assuming no extra gates are used in a typical LUT structure(s) visualization within 2410, to compute output bi and carry-out $c_i+1$ there is a plurality of LUT values (not shown) within 2410. In FIG. 24A, it is easily seen that a dedicated XOR gate can generate $b_i$, while a dedicated AND gate can generate $c_i+1$ without the need for a LUT structure 2401. The $c_{i+1}$ signal has to propagate to the highest order bit from the lowest order bit, and the total delay of incrementer computation is the sum of individual carry compute delays in the chain. For an eight bit word, this would be 8 carry compute delays. One method to compute carry faster, shown by McElvain U.S. Pat. No. 6,807,556 is shown in FIG. 25B: it comprises breaking a single carry chain into two halves, each half comprising half the depth of said single chain. This is possible when the LUT structures 2430 & 2440 have more than two inputs—i.e. 3LUTs, 4LUTs or higher input LUTs. Each structure receives three inputs: two consecutive bit inputs $a_i$, $a_{i+1}$, and carry-in input $c_i$. A first pair of LUT structures 2420 compute carry-out $c_{i+2}$ and output $b_i$, while the second pair of LUT structures 2430 compute carry-out $c_{i+2}$ and output $b_{i+1}$. For an eight bit word, this would incur 4 carry compute delays. To receive 3-inputs, the LUT structures 2430 & 2440 must be 3LUTs or higher input LUTs. However, both single and parallel computational methods utilize the same number of logic blocks—i.e. for eight bit word, 16 logic blocks. In McElvain FIG. 5, the analogy of 2 bit parallel computation is extended to 4 bit parallel computation. However, it is easily shown that this extension has its draw-backs. For a carry chain computation to work, a logical compute block must be repetitive. Such a repetitive block is shown in FIG. 24A for 1-bit compute, half of FIG. 24B for 2-bit compute, and McElvain FIG. 1B for 4-bit compute. They all require a $c_{in}$ input—even though for the first stage this $c_{in}$ input is 1 for an incrementer. For the 2-input computation, in FIG. 24B (and McElvain FIG. 4) the $c_{out}$ function is a three input ($a_i$, $a_{i+1}$, $c_i$) function. Thus typical 4LUTs can compute $c_{out}=c_{i+2}$. However, for 4-bit compute in McElvain FIG. 5 (502), both $S_7$ and $c_8$ are 5-input ($A_4$, $A_5$, $A_6$, $A_7$, $c_4$) functions—it is not possible to compute 5-input functions in 4LUT structures, and 5LUT structures are very Si inefficient in logic utilization. It is readily seen McElvain FIG. 5 does not lend to efficient 3-bit computes either due to inefficient parallelization.

An improved carry implementation utilizing the partitionable macro-LUT structure presented in FIG. 19 is discussed next, and shown in FIG. 25. Such an implementation uses fewer logic blocks and computes carry functions faster than prior art. FIG. 25A shows the block diagram for such an implementation. The logic block in FIG. 25A receives 4 inputs: three consecutive data bits $a_i$, $a_{i+1}$, $a_{i+2}$ and a carry-in signal $c_i$. Based on $c_i$, it computes the incremented values $b_i$, $b_{i+1}$, $b_{i+2}$ respectively of the 3 inputs, and generates a fast carry-out $c_{i+2}$ to the next computation block. As three consecutive bits are computed simultaneously, a 12-bit word may be incremented in 4-carry compute times, as opposed to 12-carry compute times in a single bit carry chain in FIG. 24A, or 6-carry compute times of a parallel 2-bit carry chain in FIG. 24B.

Implementation of FIG. 25A using macro-LUT structure of FIG. 19 is shown in FIG. 25B. In FIG. 25B, 2520 and 2521 are two macro-LUT structures as in FIG. 19. Carry-in $c_i$ is received on input 2511, and computed $c_{i+3}$ is provided in output 2515, the computation conducted by MUXs 2532, 2533, 2534. MUXs 2532 is configured by configuration bit 2531 to input data value zero. MUX 2534 is configured to input $c_1$. A first 3LUT 2523 receives inputs $a_i$, $a_{i+1}$, $a_{i+2}$, and the LUT values are configured to output the product $a_i a_{i+1} a_{i+2}$ on output 2526, which in turn is selected as the input to $4^{th}$ stage MUX 2533. Thus the MUX 2533 computes a fast carry-out signal $c_{i+3}$ on output 2515 in one computation cycle (MUX 2534+MUX 2534 gate delays). A second 3LUT 2522 receives inputs $a_i$, $a_{i+1}$, $c_i$, and the LUT values are configured to output $b_i$ (incremented value of $a_i$) on output 2516. Output $b_i$ computation can take longer as the time critical step is to ripple the carry signal. It is noted that output $b_{i+1}$ may be computed in 3LUT 2522 instead of $b_i$. A third 3LUT 2525 receives inputs $a_i$, $a_{i+1}$, $c_i$, and the LUT values are configured to output $b_{i+1}$ (incremented value of $a_{i+1}$) on output 2518. It is noted that output $b_i$ may be computed in 3LUT 2525 instead of $b_{i+1}$. An intermediate carry $c_{i+1}$ is computed by MUXs 2536, 2537, 2538. MUXs 2536 is configured by configuration bit 2535 to input data value zero. MUX 2534 is configured to input $c_i$ on input 2511. Input to $4^{th}$ stage MUX 2537 is selected as input 2512 $a_i$. Thus the MUX 2537 output is $c_{i+1}=a_i c_i$, which is also computed in a single carry compute cycle time. A fourth 3LUT 2524 receives inputs $a_{i+1}$, $a_{i+2}$, $c_{i+1}$, and the LUT values are configured to output $b_{i+2}$ (incremented value of $a_{i+2}$) on output 2517. Any function of three inputs can be computed by a 3LUT, and it is thus easily seen that $b_i$, $b_{i+1}$, $b_{i+2}$ can all be computed as shown in FIG. 25B. Each logic block (2520 and 2521) is a macro-4LUT. Thus three bit incrementer utilizes only two macro-4LUTs. For the example of 12-bit incrementer; FIG. 24A requires 12 4LUTs, FIG. 24B requires 12 4LUTs while FIG. 25B only requires 6 4LUTs. Thus the novel incrementer is significantly smaller and significantly faster over the prior art implementations.

Figure 25C:
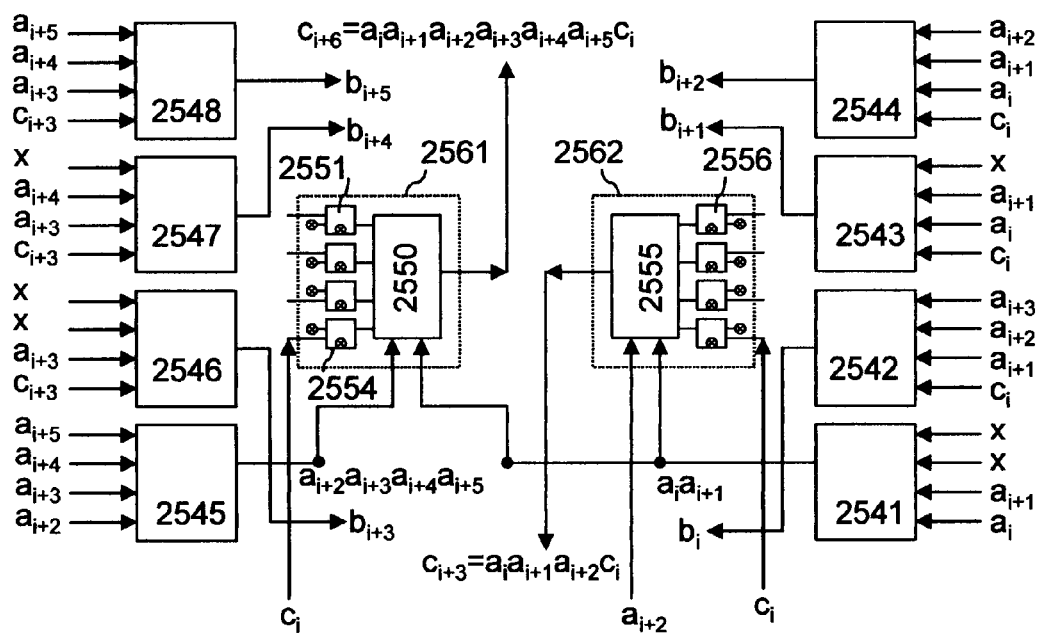

It is noted that FIG. 25B shows a first embodiment of implementing a fast incrementer in accordance with current teaching. It is easily recognized that 3LUTs in FIG. 25B may be replaced with higher input LUTs. It is also recognized that with higher input LUTs, more than 3-bits may be computed in one compute cycle, further improving incrementer performance. Such an embodiment is shown in FIG. 25C to illustrate the advantage of current invention. The incrementer adaptation of FIG. 25C is capable of incrementing 6 consecutive bits ($a_i$-$a_{i+5}$) of a word in one carry cycle, and generates the carry-out signal $c_{i+7}$. Structures 2541-2548 represent 4-input LUT functions. They receive up to 4 inputs, and compute any function of the four variables at the output. Thus 4LUTs 2542-2444 receives a subset of input signals $a_i$-$a_{i+5}$ & $c_i$ to generate the incremented data values $b_i$-$b_{i+3}$ respectively. Input x is unused. Similarly 4LUTs 2546-2448 receives inputs signals $a_{i+3}$-$a_{i+5}$ & $c_{i+3}$ to generate the incremented data values $b_{i+4}$-$b_{i+6}$ respectively. Structures 2561 & 2562 are similar to 1961 in FIG. 19. In 2561, structure 2550 is a 2LUT segment; and structures 2551-2554 are configurable MUX sections. LUT values to 2550 are configured by these MUXs—hence $c_i$ signal and three zero data value inputs are coupled to the LUT values. 4LUT 2541 is configured to produce logical AND operation $a_i a_{i+1}$ at the output, which is coupled to input of both 2550 and 2555. 4LUT 2545 is configured to produce logical AND operation $a_{i+2}a_{i+3}\ a_{i+4}a_{i+5}$ at the output, which is coupled to input of 2550. Input $a_{i+2}$ is used as second input to 2555. Thus final stage of 2LUT 2550 computes $c_{i+7}$ signal in a single 2LUT delay, and final stage of 2LUT 2555 computes $c_{i+3}$ in a single 2LUT delay. This $c_{i+3}$ is used as inputs for other 4LUTs as shown in FIG. 25C. In this structure, a 12-bit word can be incremented in 2 carry-compute times (compared to 4 in FIG. 25B), but at a higher Si area of sixteen 4LUTs+four 2LUTs (compared to eight 4LUTs in FIG. 25B). One familiar in the art may easily design many alternative implementations for incrementers/decrementers using the techniques presented above.

The macro 4LUT 1900 is capable of performing a wide variety of logic implementations beside carry logic. These capabilities allow enhanced logic packing into the said 4LUT structure. Partial outputs generated within a first macro LUT can be fed as inputs within the same first macro LUT, and outputs generated in adjacent second macro LUTs can be fed as inputs to the first macro LUT.

Each of the circuits described in FIG. 11 thru FIG. 20 provides a programmable means to configure the LUT macrocell. In a first embodiment the programmable content is comprised of RAM or ROM elements, wherein a user can configure the device in the field or during fabrication. In a second embodiment, the programmable content comprises a memory circuit fabricated with two selectable manufacturing configurations. In a first selectable configuration a RAM circuit is formed to provide said LUT user re-programmability. In a second selectable configuration a ROM circuit is formed in lieu of one specific RAM pattern to provide identical LUT programmability.

New programmable LUT circuits are described for use in large and fine geometry FPGA devices. As the logic density increases, there is a need to add more LUTs into a logic block, and increase the LUT size. Both inhibit the efficiency of Silicon utilization when porting logic synthesized to an ASIC flow. Compared to 2LUT based logic blocks, 4LUTs are seen to be only 36% efficient, while 7LUTs are only 7% efficient. The new LUT circuits disclosed herein make use of additional programmable elements inside the large LUT structure, enabling sub-division of LUTs. A complex design can be fitted as a single larger logic LUT or as many smaller logic LUT pieces: both maximizing the Silicon utilization. A 2LUT divisible 4LUT macro-cell shown in FIG. 16A provides a 2× improvement in logic packing compared to hard-wired 4LUT logic elements. The increased memory content is justified by a 3-dimentional thin-film transistor module integration that allows all configuration circuits to be built vertically above logic circuits. These memory circuits contain memory elements that control pass-gates constructed in substrate Silicon. The TFT layers are fabricated above a contact layer in a removable module, facilitating a novel method to remove completely from the process. Configuration circuits are mapped to a hard-wire metal links to provide the identical functionality in the latter. Once the programming pattern is finalized with the thin-film module, and the device is tested and verified for performance, the TFT cells can be eliminated by hard-wire connections. Such conversions allow the user a lower cost and more reliable end product. These products offer an enormous advantage in lowering NRE costs and improving TTS in the ASIC design methodology in the industry.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A programmable look-up-table (LUT) structure adapted for carry logic incrementer implementation in an integrated circuit, comprising:
   three or more data inputs and a carry-in input, said data inputs comprised of consecutive bits in a data string, said carry-in comprised of the increment value to the least order bit of said data string; and
   three or more data outputs and a carry-out output, said data outputs comprised of the incremented values of said data inputs, and said carry-out resulting from the incremented value of the highest order bit of said data inputs;
   wherein, said three or more data outputs are computed in a single carry computation stage within the LUT structure.

2. The structure of claim 1, further comprising a first LUT segment comprised of:
   a first LUT circuit comprising:
      a plurality of said data inputs as inputs; and
      a plurality of configurable LUT values configured to produce a logical function of said data inputs at an output; and
   a configurable multiplexer (MUX) circuit comprising:
      a plurality of configurable elements; and
      a said configurable element configured to program the carry-in input and a data value input as inputs to the MUX; and
      a said configurable element configured to program the first LUT circuit output as select input to the MUX;
      wherein, the MUX circuit output generates said carry-out.

3. The structure of claim 2, wherein the first LUT segment further comprises:
   a second LUT circuit comprising:
      a plurality of said data inputs as inputs; and
      the carry-in as an input; and
      a plurality of configurable LUT values configured to produce an incremented data value of a said data input at an output.

4. The structure of claim 1, further comprising a second LUT segment comprised of:
   a configurable multiplexer (MUX) circuit comprising:
      a plurality of configurable elements; and
      a said configurable element configured to program the carry-in input and a data value input as inputs to the MUX; and
      a said configurable element configured to program a said data input as select input to the MUX;
      wherein, the MUX circuit output generates an intermediate carry signal.

5. The structure of claim 4, wherein the second LUT segment further comprises:
   a first LUT circuit comprising:
      a plurality of said data inputs as inputs; and
      the carry-in as an input; and a plurality of configurable LUT values configured to produce an incremented data value of a said data input at an output.

6. The structure of claim 4, wherein the second LUT segment further comprises:
a second LUT circuit comprising:
a plurality of said data inputs as inputs; and
the intermediate carry as an input; and
a plurality of configurable LUT values configured to produce an incremented data value of a said data input at an output.

7. The structure of claim 1, wherein the carry-out signal is computed by the last stage of a LUT circuit, and wherein a first portion of the LUT circuit computes a logical output of a plurality of said three data inputs.

8. The structure of claim 1, wherein the LUT structure is programmed by configuring data stored in configuration memory elements.

9. The structure of claim 8, wherein said memory elements comprise one or more of: fuse link, anti-fuse capacitor, resistor, laser-fuse, SRAM cell, DRAM cell, metal optional link, EPROM cell, EEPROM cell, flash cell, ferro-electric element, optical element, electrochemical element, electrolytic element, Carbon nano-tube, electro mechanical element, electro-magnetic element and magnetic element.

10. A look up table (LUT) structure adapted to implement a carry logic incrementer in a programmable integrated circuit, comprising:
a plurality of consecutive data bits and a carry-in signal received as inputs; and
a first intermediate LUT circuit receiving one or more of the data-bits and the carry-in signal as inputs to generate an incremented data value of one of the data bits; and
a second intermediate LUT circuit receiving said plurality of data bits to generate a logical output; and
a first final stage generating a carry-out signal, wherein:
a logic zero and said carry-in signal are configured as LUT value inputs; and
said second LUT output is configured as the select input.

11. The structure of claim 10, wherein the second intermediate LUT circuit performs an AND logical operation of the plurality of data bit inputs.

12. The structure of claim 10, further comprising a third intermediate LUT circuit receiving one or more of the data-bits and the carry-in signal as inputs to generate an incremented data value of one of the data bits.

13. The structure of claim 12, further comprising:
a second final stage generating an intermediate carry signal, wherein:
a logic zero and said carry-in signal are configured as LUT value inputs; and
a said data bit is configured as the select input.

14. The structure of claim 13, further comprising a fourth intermediate LUT circuit receiving one or more of the data-bits and the intermediate carry signal as inputs to generate an incremented data value of one of the data bits.

15. The structure of claim 14, wherein the first, second, third and fourth intermediate LUT circuits comprise at least three inputs received in true and complement polarity.

16. A look up table (LUT) structure adapted for a carry logic incrementer, comprising:
a plurality of inputs comprised of consecutive data bits to be incremented; and
a carry-in input signal to compute the incremented value of the least order data bit; and
a carry-out output signal resulting from the incremented value of the highest order data bit; and
a first intermediate LUT circuit computing a logical function of said plurality of data bit inputs at the first intermediate LUT circuit output; and
a first configurable multiplexer (MUX1) structure comprising:
the carry-in configured as a first input; and
an output of a data storage unit configured as a second input; and
the output of said intermediate LUT circuit configured as a select input; and
the carry-out logic signal generated at an output.

17. The structure of claim 16, wherein the first intermediate LUT circuit generates the product of said plurality of data bits as the first intermediate LUT output.

18. The structure of claim 16, further comprised of a second configurable multiplexer (MUX2) structure comprising:
the carry-in configured as a first input; and
an output of a data storage unit configured as a second input; and
the lowest order bit configured as a select input; and
an intermediate carry signal generated at an output.

19. The structure of claim 18, further comprised of a second intermediate LUT circuit wherein one or more of said plurality of data bit inputs and the intermediate carry signal are received as LUT inputs to generate an incremented value of a said data bit at the second intermediate LUT circuit output.

20. The structure of claim 16, further comprised of a third intermediate LUT circuit wherein one or more of said plurality of data bit inputs and the carry-in signal are received as LUT inputs to generate an incremented value of a said data bit at the third intermediate LUT circuit output.

* * * * *